United States Patent [19]
Amano et al.

[11] Patent Number: 5,492,011
[45] Date of Patent: Feb. 20, 1996

[54] ACCELERATION SENSOR

[75] Inventors: Akira Amano; Kazuo Matsuzaki; Toshiaki Sakai, all of Kawasaki, Japan

[73] Assignee: Fuji Electric Co., Ltd., Kanagawa, Japan

[21] Appl. No.: 438,973

[22] Filed: May 11, 1995

Related U.S. Application Data

[62] Division of Ser. No. 154,025, Nov. 18, 1993.

[30]   Foreign Application Priority Data

| Nov. 19, 1992 | [JP] | Japan | 4-309921 |
| Feb. 8, 1993 | [JP] | Japan | 5-19965 |
| Jul. 5, 1993 | [JP] | Japan | 5-165269 |

[51] Int. Cl.⁶ ............................................. G01L 1/00
[52] U.S. Cl. ........................... 73/514.25; 73/514.16
[58] Field of Search .................................. 313/351, 336, 313/309; 73/754, 723, 717, 715, 514.16, 514.25

[56]   References Cited

U.S. PATENT DOCUMENTS

| 5,079,958 | 1/1992 | Takase et al. |         |
| 5,148,079 | 9/1992 | Kado et al. | 313/336 |
| 5,163,328 | 11/1992 | Holland et al. | |
| 5,176,557 | 1/1993 | Obunuki et al. | |
| 5,265,470 | 11/1993 | Kaiser et al. | |
| 5,277,067 | 1/1994 | Holland et al. | |
| 5,301,554 | 4/1994 | Kane et al. | |
| 5,386,172 | 1/1995 | Komatsu | 313/351 |

FOREIGN PATENT DOCUMENTS

0512129A1   11/1992   European Pat. Off. .

OTHER PUBLICATIONS

Abstract, Database WPI, Week 9003, Derwent Publications Ltd., London, GB; AN 90–019729 & JP–A–1 300 558 (Agency of Ind. Sci. Tech.) 5 Dec. 1989.

European Search Report for Appl. No. 93118292.7 dated Nov. 18, 1994.

Physical Properties of thin–film field emission cathodes with molybdenum cones, C. A. Spindt, et al., Sanford Research Institute, Menlo Park, CA Journal of Applied Physics, vol. 47, No. 12, pp. 5248–5263, Dec. 1976.

Technical Report, pp. 62–65, Monthly Journal, Semiconductor World 1992.3.

*Primary Examiner*—Richard Chilcot
*Assistant Examiner*—R. Biegel
*Attorney, Agent, or Firm*—Finnegan, Henderson, Farabow, Garrett & Dunner

[57]   ABSTRACT

A force sensor comprises a substrate having a movable unit which is displaceable in response to one of an applied force and acceleration; an electron emission unit having a cathode for emitting electrons in accordance with an applied potential; an electron absorption unit having an anode for capturing electrons emitted from the cathode, the electron emission unit and the electron absorption unit being formed on a surface of the substrate; and a control unit for, on the basis of the displacement of the movable unit, controlling the electron capturing efficiency of the anode with respect to electrons emitted from the cathode.

5 Claims, 18 Drawing Sheets

X(Y) AXIAL DIRECTION DISPLACEMENT

Z-AXIAL DISPLACEMENT

ACCELERATION SENSOR

This is a division of application Ser. No. 08/154,025, filed Nov. 18, 1993, now pending.

BACKGROUND OF THE INVENTION

1. Field of the Invention

The invention relates to a force sensor for measuring acceleration or force applied to a body or the pressure of a fluid, a temperature sensor for measuring the temperature of various atmospheres or the like, and a temperature/force sensor device provided with these functions. More particularly, the invention relates to a sensing mechanism which uses the cold emission.

2. Discussion of the Related Art

Sensors for measuring a physical quantity in various atmospheres are requested to have an improved sensitivity, the compatibility with the atmosphere under measuring, etc. Under this situation, new type sensors have been developed. A sensor shown in FIGS. 34 and 35, for example, is a device for detecting a pressure applied to the device using the piezoresistance effect of a resistor (conductor or semiconductor) which is a phenomenon wherein the electric resistance of the resistor is changed depending on the change of the resistivity due to the pressure. Such a device is mainly employed in measuring acceleration applied to a body, and therefore called an acceleration sensor. The acceleration sensor is a semiconductor sensor in which the resistor is made of a semiconductor. Specifically, an Si (silicon) substrate 141 has a thin portion at its center, and an air gap 148 is formed so as to surround the thin portion except a supporting unit 151. A weight 152 is fixed to the back of the thin portion and functions as a moving unit 142.

On the surface of the supporting unit 151, disposed are piezoresistance units 143 which detect their deformation (the change in resistivity). The piezoresistance units 143 are connected to a lead wire 149 through a diffusion conductor layer 144 and bonding pads 145. The Si substrate 141 is attached by the technique of electrostatic adhesion or the like to a glass cover 146 having a cavity 147, thereby constructing the semiconductor acceleration sensor. When a pressure due to acceleration of a body is applied to the thus configured semiconductor acceleration sensor, the supporting unit 151 elastically deforms to bend, and the moving unit 142 is displaced in accordance with the bend. This causes the electric resistances of the piezoresistance units 143 disposed on the surface of the supporting unit 151 to change in proportion to the deform of the supporting unit 151. Accordingly, the acceleration can be measured from the change of the electric resistances.

FIG. 36 shows another prior art pressure sensor, and FIG. 37 shows in an enlarged scale a strain gauge unit of the sensor. The pressure sensor is a semiconductor pressure sensor in which the electric resistor is made of a semiconductor and which measures a pressure change of a fluid. In the semiconductor pressure sensor, a diaphragm unit 176 is formed by partially thinning an Si substrate 161. In the upper portion of the Si substrate, formed are a strain gauge unit (piezoresistance unit) 171, an operational amplifier unit 173 for amplifying a resistivity change of the strain gauge unit 171, and a thin-film resistor unit 174. The reference numeral 172 designates aluminum wiring patterns, and 175 designates a surface protection film. The Si substrate 161 configured as described above is placed on a base 167 through glass pedestals 164 having a thermal expansion coefficient which is similar to that of silicon, and then sealed in a metal case 166 while being connected to terminals 169 through Au wires 165. In the thus configured semiconductor pressure sensor, when the pressure of a fluid flowing through an introduction pipe 170 increases, the stress causes the diaphragm unit 176 to elastically deform so that the resistance of the strain gauge unit 171 disposed above the diaphragm unit 176 is changed in proportion to the stress (distortion). This resistivity change is amplified by the operational amplifier unit 173 to be output. The fluid pressure can be measured by converting the obtained resistivity change to the value of the stress.

Both the pressure sensors shown in FIGS. 34 and 37 are semiconductor pressure sensors in each of which the electric resistor is made of a semiconductor. The gauge factor of such a semiconductor pressure sensor which is an index to the sensitivity is several ten times that of a metal strain gauge pressure sensor having an electric resistor made of a metal wire or foil. Therefore, a semiconductor pressure sensor has advantages such as that the sensitivity is excellent, and that the output level is so high as to be easily amplified.

However, a prior art semiconductor pressure sensor uses the piezoresistance effect of an electric resistor. Even in a semiconductor pressure sensor having an Si substrate which is relatively excellent in sensitivity, therefore, the resistivity change is as small as about 2% when the rated output is applied, thereby producing a problem in that such a sensor cannot accurately measure a pressure. Moreover, since such a resistor shows a large change in physical property (large negative temperature characteristic) against temperature or pressure, a prior art semiconductor pressure sensor requires a temperature compensating circuit, thereby producing another problem in that such a sensor is inferior in environmental resistance. In a prior art pressure sensor, for example, under an environment of a high temperature (about 120° C.), a high pressure (about 20 arm.), and radioactive rays, a large leak current flows irrespective of the degree of distortion due to a pressure so that such a prior art sensor cannot perform a highly reliable measurement under such conditions. There is a further problem in that the resistance of the piezoresistance unit easily fluctuates (about 1%/1,000 Hr).

In the same manner as a pressure sensor, also a temperature sensor is requested to have a higher environmental resistance to a high temperature, radioactive rays, or the like. Under the present status of the art, however, such a requirement has not yet been satisfied.

SUMMARY OF THE INVENTION

Accordingly, in view of the above-mentioned problems, it is an object of the invention to realize a force sensor and a temperature sensor which have a novel structure. It is another object of the invention to provide a force sensor, a temperature sensor, and a temperature/force sensor device which have a high sensitivity, an excellent environmental resistance, and a high reliability.

In order to solve the problems, the invention has developed a novel force sensor using cold electrons which are emitted by applying an electric field to a cathode under a low pressure. The force sensor of the invention comprises: a substrate having a movable unit which is displaceable in response to an applied force or acceleration; an electron emission unit having a cathode for emitting electrons in accordance with an applied potential; an electron absorption unit having an anode for capturing electrons emitted from the cathode, the electron emission unit and the electron absorption unit being formed on the surface of the substrate; and control means for, on the basis of the displacement of the movable unit, controlling the electron capturing efficiency of the anode with respect to electrons emitted from the cathode.

Preferably, an auxiliary anode for attracting electrons emitted from the cathode to direct the electrons toward the anode field is formed between the cathode and the anode.

In the invention, one of the electron emission unit and the electron absorption unit may be formed on the movable unit. In this case, the control means may be electron path displacement means for displacing an electron path from the cathode to the anode on the basis of the displacement of the movable unit, thereby controlling the electron capturing efficiency. An electric field defining electrode for defining the electric field distribution in the vicinity of the anode may be disposed, and a bias electrode for displacing the movable unit by means of an electrostatic attractive force or electrostatic repulsive force may be disposed.

The control means may be a shielding unit which is disposed on the movable unit and which changes a state of shielding an electron path from the cathode to the anode on the basis of the displacement of the movable unit, thereby controlling the electron capturing efficiency. The movable unit may be a diaphragm unit which is formed by thinning the substrate at a location between the electron emission unit and the electron absorption unit and which can be deformed by an applied force or acceleration, and the diaphragm unit itself may be used as the control means which displaces to block the electron path from the cathode to the anode, thereby controlling the electron capturing efficiency. The cathode of the electron emission unit may be formed at the center on the movable unit, the anode of the electron absorption unit may consist of a plurality of independent anode units for the X-axis and Y-axis which are formed around the movable unit and rotationally symmetric with a step of 90 deg. in the circumferential direction. In contrast, the anode of electron absorption unit may consist of a plurality of independent anode units for the X-axis and Y-axis which are formed on the movable unit and rotationally symmetric with a step of 90 deg. in the circumferential direction, and the cathode of the electron emission unit may be formed around the movable unit. An anode unit dedicated to the Z-axis may be formed at the middle of the anode unit for the X-axis and the anode unit for the Y-axis. The cathode may have a circular or annular shape. Preferably, the cathode has a comb-like annular shape.

The movable unit may be a one-end-supported movable unit which projects in a beam-like manner from a thick portion of the substrate and which can be deformed by an applied pressure.

According to the invention, a second electron emission unit having a second cathode for emitting electrons in accordance with an applied potential, and a second electron absorption unit having a second anode for capturing electrons emitted from the second cathode, the second electron emission unit and the second electron absorption unit being formed on the back of the movable unit may be formed, and a filling material may be disposed which is filled under the second electron emission unit and the second electron absorption unit and which applies a pressure to the second electron emission unit and the second electron absorption unit in accordance with a pressure which is applied from the surface side of the substrate.

The substrate may be a semiconductor substrate.

According to the invention, a pressure detection type temperature sensor can be configured by providing the force sensor having the aforementioned configuration with temperature-pressure conversion means which applies a pressure corresponding to a temperature to the movable unit. In this case, the temperature-pressure conversion means is a gas filled unit which is on the back of the movable unit, which is filled with a gas, and which applies a volume change of the gas in the form of a pressure change to the movable unit, the volume change being due to a temperature change. Preferably, an inert gas is filled in the gas filled unit.

A temperature/force sensor device may be configured by forming the above-mentioned force sensor and temperature sensor on the same substrate. In this case, the cathode in the side of the force sensor and the cathode in the side of the temperature sensor may be commonly used in the force sensor side and the temperature sensor side.

According to the force sensor of the invention having such means, a force sensor can be realized in which, in view of the electric field emission under a low pressure from the cathode (cold cathode) to the anode, the control means based on a movable unit deformable by a force or acceleration determines the capturing efficiency of electrons to be captured by the anode. When cold electrons emitted from the cathode reach the anode, the anode outputs a current in accordance with the number of the captured electrons. Therefore, the force or acceleration can be measured from the rate of change of the output current caused by the control means which controls the electron capturing efficiency of the anode on the basis of the displacement of the movable unit. The rate of change of the output current which functions as an index of the measurement can be set to be 100% at the maximum, and the output current largely changes in accordance with a pressure. Therefore, the sensor has an excellent sensitivity. Since the electric field emission is used, it is possible to construct a force sensor which has an excellent resistance to radioactive rays, a high temperature and a high pressure, and a high environmental resistance. Accordingly, even under a condition which is environmentally very severe, such as the inside of an engine for an automobile, a jet plane, a ship, or the like, it is possible to measure a pressure. Since the construction is simplified, the cost can be reduced.

In the force sensor, when one of the electron emission unit and the electron absorption unit is formed on the movable unit and the control means is electron path displacement means for displacing an electron path from the cathode to the anode, also the electron emission unit or the electron absorption unit is positionally displaced following the movable unit which is displaced by a pressure. Therefore, the level of the electron emission unit becomes different from that of the electron absorption unit, thereby constituting a barrier to electrons which proceed in a direction substantially parallel to the substrate. This allows the pressure to be measured from the rate of change of the output current. When the control means is a shielding unit which is disposed on the movable unit and can shield the electron path from the cathode to the anode, the shielding unit displaces following the displacement of the movable unit and opens the electron path so as to change the electron capturing efficiency, thereby attaining the same effects as those of the above-mentioned pressure sensor. When the movable unit is a diaphragm unit which is formed by thinning the substrate and the control means is electron path displacement means for displacing an electron path from the cathode to the anode on the basis of the displacement of the diaphragm unit, the same effects as those of the above-mentioned control means can be attained. When an electric field defining electrode for defining the electric field distribution in the vicinity of the anode is formed, the electron path can be diffused or converged, thereby improving the sensitivity or the resolution. When a bias electrode for displacing the movable unit by means of an electrostatic attractive force or electrostatic repulsive force is formed, the operation check of the sensor can easily be performed so as to contribute to simplification of the test. The characteristics of sensors can be standardized by performing the measurement while applying to the bias electrode a potential corresponding to the characteristic deviation of the respective sensors. Therefore, the bias electrode can function as a calibration electrode.

When a plurality of independent anode units are formed on the X-axis and Y-axis, multidimensional components (including moment components) of a force or acceleration can be detected.

When the movable unit in such a force sensor is constructed as a one-end-supported movable unit which projects in a beam-like manner from the thick portion of the substrate, the front end of the one-end-supported movable unit has an easy-reaction property that it largely moves in accordance with a pressure. Therefore, the force sensor can detect a minute change in force. The sensor may comprise on the back of a substrate a second electron emission unit, a second electron absorption unit, and a filling material for applying a pressure to the second electron emission unit and the second electron absorption unit in accordance with a pressure which is applied from the surface side of a substrate. This results in that an output current unit (electron absorption unit) is formed in each of the surface and back of the substrate. Therefore, it is possible to obtain a large output current so that the rate of change of the output current becomes remarkable, whereby the sensitivity of the force sensor can further be improved. When an upper electrode is formed above the substrate in such a manner that the principle face of the electrode opposes the surface of the substrate, a stress due to the electric field repulsion can be generated on the surface of the substrate by applying the same high potential to both the upper electrode and the surface of the substrate. Therefore, the operation check of the force sensor can be performed easily and in advance.

In the aforementioned pressure sensors, the material of the substrate can be any of a conductor (semiconductor) and an insulator, as far as the movable unit can be formed. Therefore, the substrate may be made of a metal, a semiconductor, glass, or the like. When a semiconductor substrate is employed, particularly, it is possible to conduct a fine patterning in the order of one micron. Accordingly, a pressure sensor can be miniaturized and the range of its use can be increased.

When the force sensor is provided with temperature-pressure conversion means for applying a pressure corresponding to a temperature to the movable unit, it is possible to constitute a temperature sensor. In this case, the temperature-pressure conversion means may be a gas filled unit which is on the back of the movable unit, which is filled with a gas, and which applies a volume change of the gas in the form of a pressure change to the movable unit, the volume change being due to a temperature change. The gas in the gas filled unit expands or contracts in response to a temperature change so that a pressure corresponds to the temperature. As a result, the displacement of the movable unit corresponding to the pressure change causes the electron capturing efficiency of the anode to be changed, thereby allowing the temperature to be measured.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

DETAILED DESCRIPTION OF THE PREFERRED EMBODIMENTS

Referring to the accompanying drawings, embodiments of the invention will be described.

[Embodiment 1]

Figure 1:
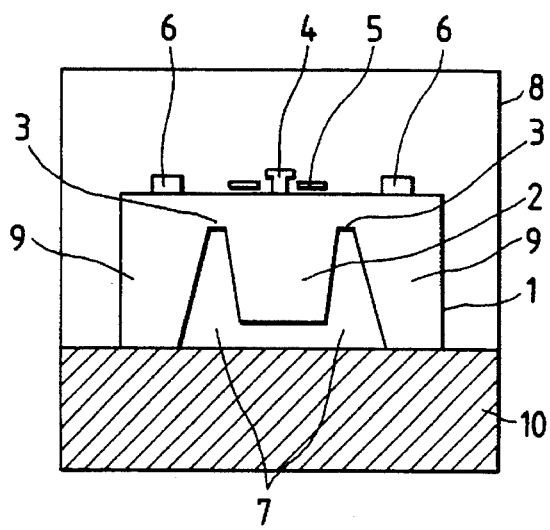
FIG. 1 is a section view showing the configuration of a pressure sensor according to Embodiment 1 of the invention.
Figure 2:
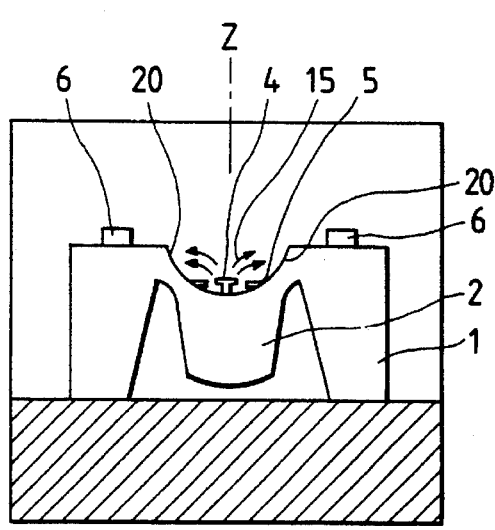
FIG. 2 is a section view showing a state in which a pressure due to an acceleration is applied to the pressure sensor.
Figure 3:
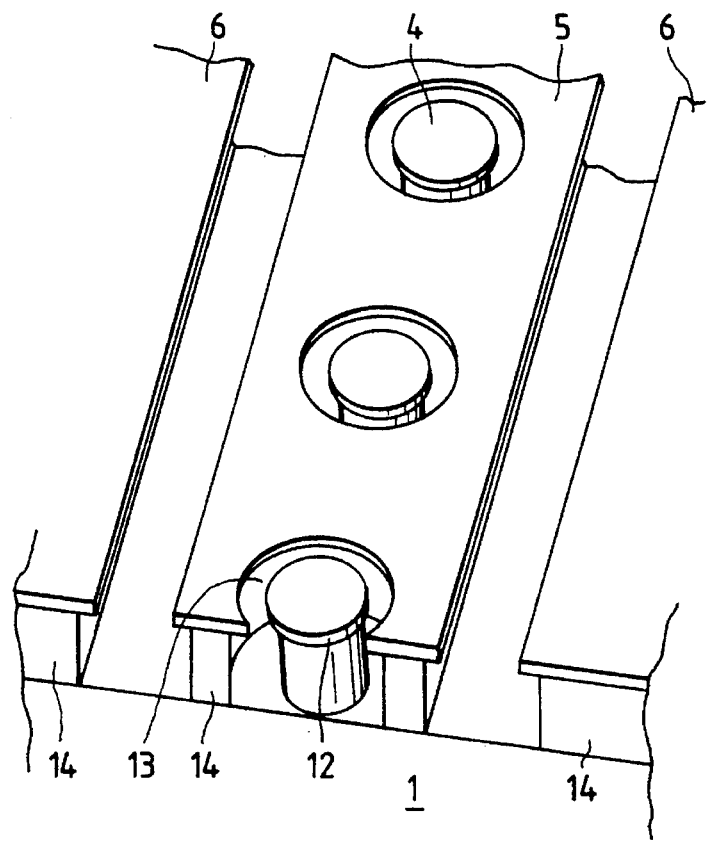
FIG. 3 is a perspective view showing in an enlarged scale electrodes which are formed on a substrate in the pressure sensor.
Figure 4:
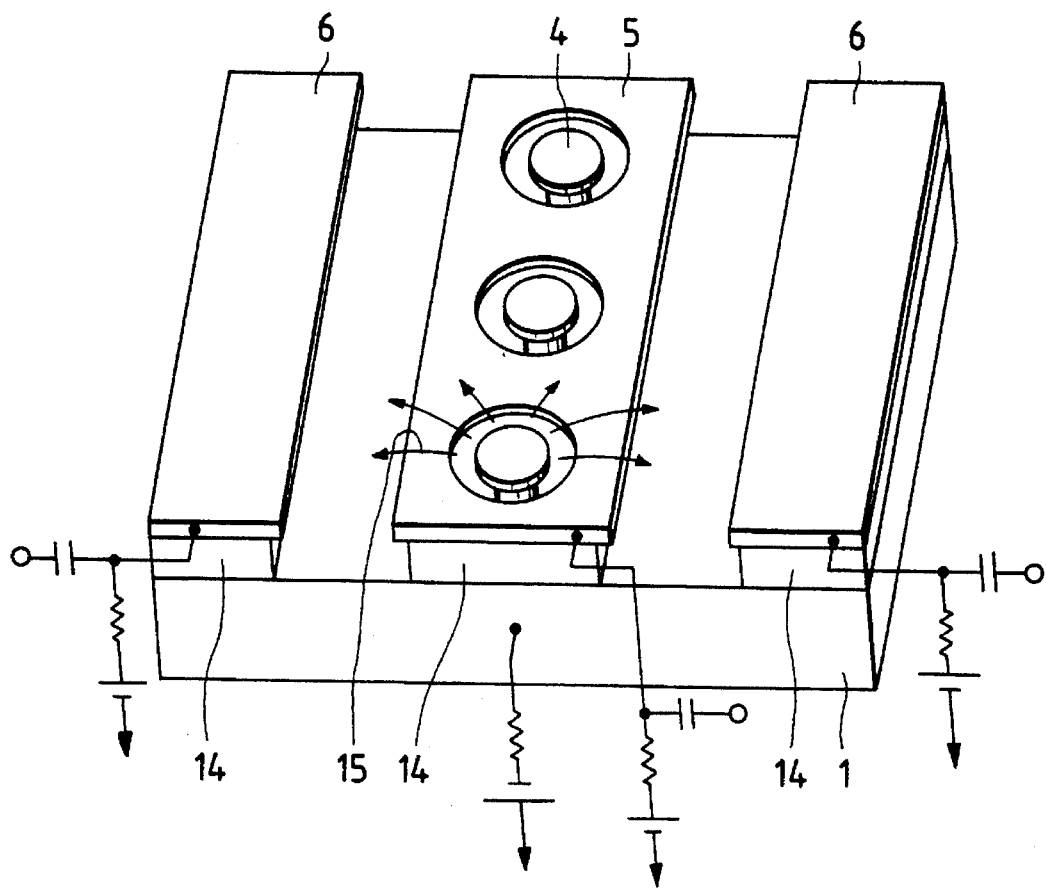
FIG. 4 is a diagram illustrating a bias state of the electrodes in the pressure sensor.

Hereinafter, a pressure sensor of Embodiment 1 of the invention will be described with reference to FIGS. 1 to 4. FIG. 1 is a section view showing the configuration of the pressure sensor of Embodiment 1 of the invention, FIG. 2 is a section view showing a state in which a pressure is applied to the pressure sensor, FIG. 3 is a perspective view showing in an enlarged scale electrodes which are formed on a substrate, and FIG. 4 is a diagram illustrating a bias state of the electrodes. The embodiment is a pressure sensor of the acceleration measuring type which operates in response to a pressure due to acceleration and measures the magnitude of the pressure.

In the figures, the pressure sensor of the embodiment uses an Si substrate 1 as a substrate (elastic member having a movable unit). Anisotropic etching is conducted on the back of the Si substrate 1 to form two V-like grooves 7 which reach the vicinity of the surface of the Si substrate 1. The back portion in the region between the two V-like grooves 7 is removed to form a suspended movable unit 2 which is connected to thick portions 9 through thin supporting units 3. On the surface of the Si substrate 1 having the shape described above, an electron emission unit (electric field emission unit) consisting of emitter electrodes (cold cathodes) 4 and a gate electrode (control electrode) 5 is formed at a location above the movable unit 2, and an anode electrode (anode) 6 functioning as an electron absorption unit is formed at a location above each of the thick portions 9 which are fixed units. Each of the emitter electrodes 4 formed in the center area on the movable unit 2 has a column-like shape in which an eaves portion 12 projects outward from the periphery of the top. The emitter electrodes 4 are formed in the following manner: an aluminum film and a tungsten film are deposited in this sequence on the surface of the Si substrate 1, a reactive ion etching is conducted to form the eaves portions 12 made of the tungsten film, and the aluminum film is etched away using a phosphoric acid etchant to form column portions. The gate electrode 5 is a plate-like tungsten film which has a plurality of openings 13 respectively corresponding to the emitter electrodes 4 and which is disposed on the Si substrate 1 through an insulating film 14. The outer diameter of the eaves portion 12 of each of the emitter electrodes 4 is about 1.5 μm, and the inner diameter of each of the openings 13 of the gate electrode 5 is about 3 μm. The distance between the edge of the eaves portion 12 and that of the corresponding opening 13 is in close proximity of about 0.75 μm. The emitter electrodes 4 have a height of about 1 μm and the axes of the adjacent emitter electrodes are separated from each other by about 10 μm. In a similar manner as the gate electrode 5, each of the anode electrodes 6 consists of a plate-like tungsten film, and is disposed on the Si substrate 1 through the insulating film 14 and at a location separated from the emitter electrode 4 by about 5 mm. The anode electrodes 6 are positioned in the areas lateral to the emitter electrode 4, respectively. The Si substrate 1 on which these electrodes are formed is soldered to a base 10, and then sealed in a glass cap 8 wherein a high vacuum atmosphere of a degree of vacuum of $10^{-5}$ to $10^{-6}$ Torr is produced.

The pressure sensor of the embodiment having the configuration described above is used under a bias state shown in FIG. 4. More specifically, the emitter electrodes 4 are biased to be negative, and the gate electrode 5 and the anode electrodes 6 to be positive. When the gate voltage applied to the gate electrode 5 exceeds the threshold of about 80 v, the strength of an external electric field applied to the emitter electrodes 4 becomes about $10^9$ V/m or higher. This causes the potential barrier of the surface of each of the emitter electrodes 4 to decrease in height and width. Accordingly, the field emission of the Schottky effect (quantum mechanical tunnel effect) occurs so that electrons 15 are emitted from the emitter electrodes 4. In the embodiment, since emitter electrodes 4 have a planar structure having the above-mentioned eaves portions 12, cold electrons 15 are emitted mainly from the edge of each of the eaves portions 12 where the electric field is concentrated, in a direction substantially parallel to the Si substrate 1. The electrons 15 emitted from the emitter electrodes 4 proceed over the gate electrode 5 and are then captured by the anode electrodes 6 to be detected as an anode current (the emission current from the emitter electrodes 4 is about 10 μA per one of the emitter electrodes 4).

In the pressure sensor of the embodiment, the Si substrate 1 is held only by the supporting units 3 which are formed by partially thinning the Si substrate 1, and the suspended movable unit 2 which has an appropriate weight. When an acceleration or a pressure G is applied to the surface of the Si substrate 1 in the direction of the Z- axis, therefore, the movable unit 2 is displaced in accordance with the deflection of the supporting units 3 so as to be depressed downward. At this time, the depression of the movable unit 2 causes a barrier 20 to appear in a relative manner in the boundaries of the movable unit 2 and the supporting units 3, and the barrier 20 blocks the path of the electrons 15 emitted from the eaves portions 12 of the emitter electrodes 4, so that the electrons 15 cannot reach the anode electrode 6. More specifically, the electrons 15 emitted from the eaves portions 12 of the emitter electrodes 4 proceed in a direction substantially parallel to the Si substrate 1 without scattering in the glass cap 8. When the movable unit 2 is displaced to be depressed and the barrier 20 appears, therefore, the collecting electric field distribution is disturbed in a degree proportion to the height of the barrier 20 or the magnitude of the pressure acting on the movable unit 2, so that the number of the electrons 15 reaching the anode electrodes 6 is deceased and also the anode current output therefrom is decreased. Accordingly, the degree of the displacement of the movable unit 2 in the direction of the Z-axis can be obtained from the obtained rate of change of the anode current. The acceleration can be calculated by converting the rate of deformation of the Si substrate 1. In other words, in the structure where the emitter electrodes 4 (the electron emission unit side) are formed on the movable unit 2, the electron path (electric field distribution) from the emitter electrodes 4 to the anode electrodes 6 is changed on the basis of the spatial displacement of the movable unit 2. Therefore, this structure functions as the electron path displacement means (control means), and controls the electron capturing efficiency of the anode electrodes 6.

As described above, in the pressure sensor of the embodiment, the emitter electrodes 4 and gate electrode 5 which function as the electron emission unit are formed on the movable unit 2, and the anode electrodes 6 which function as the electron absorption unit are formed on the thick portions 9. When the movable unit 2 is displaced by a pressure, therefore, the amount of the emitted electrons 15 which are absorbed by the anode electrodes 6 is decreased in accordance with this displacement so that also the output anode current is decreased. From the rate of change of the anode current, the degree of the pressure, i.e., the acceleration can be measured. Unlike a prior art pressure sensor which uses the piezoresistance effect of a resistor, therefore, the embodiment has the electron emission unit which uses the Schottky effect and in which the current density is substantially independent of the temperature, thereby eliminating the necessity of the temperature compensation. Accordingly, it is possible to construct a sensor which exhibits superior characteristics in a radioactive-ray environment and a high-temperature and high-pressure environment or has an excellent environmental resistance. The current density j of cold electrons which are field-emitted from the emitter electrodes (cold cathodes) 4 is given by Fowler-Nordheim equation:

$$j = AF^2/\phi \exp(-B \phi^{3/2}/F)$$

In the above equation, $F=\beta V$ where $\beta$ is the geometric quantity coefficient, V is the potential difference between the emitter electrodes 4 and gate electrode (anode), $\phi$ is the work function of the emitter electrodes (cathode metal: tungsten) 4, and A and B are constants. Although the equation is obtained assuming that the temperature is 0° K. and that electrons lower than Fermi level are emitted, it is experimentally known that the equation is not largely dependent on temperature. Therefore, the equation is usually used for the case of ordinary temperature or higher.

Since the variation of the charge collecting rate of the anode electrodes 6 depends on the change of the electric field distribution due to the spatial displacement of the movable unit 2, the rate of change of the anode current can be varied largely in accordance with the pressure by adequately setting the geometrical arrangement and deformed shape of the elements such as the movable unit 2, the emitter electrodes 4 and the anode electrodes 6, whereby a high-sensitivity pressure sensor is realized. Since the current density of the cold electron emission can be varied easily by changing the potential difference V between the electrodes, the pressure sensor can detect a minute pressure and has a wide dynamic range. The sensor can be constructed by a semiconductor producing process, and therefore the mass production of the sensor contributes to the reduction of the cost.

Figure 5:
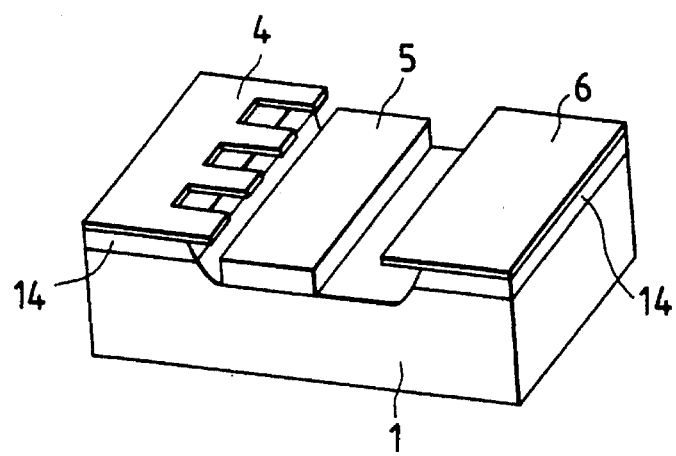
FIG. 5 is a perspective view showing examples of electrodes which may be used as the electrodes of the pressure sensor.

In the invention, the shape and number of the electrodes are not restricted to those of the embodiment. FIG. 5 shows an example in which the electrodes are configured in a manner different from the above. In the figure, the parts corresponding to those of the pressure sensor of FIG. 1 are designated by the same reference numerals. In FIG. 5, an emitter electrode 4 is made of a tungsten film having a comb-like shape, and disposed on an Si substrate 1 through an insulating film 14 so as to project toward a gate electrode 5 which is disposed at a lower level. For example, the comb-like emitter electrode 4 may be configured so that each comb tooth has a width of 2 to 3 μm, a length (depth) of 20 to 30 μm and a thickness of 1 μm and the pitch of the teeth is 10 μm. The gate electrode 5 has a plate-like shape and is directly disposed on the Si substrate 1. An anode electrode 6 which also has a plate-like shape is located on the Si substrate 1 through the insulating film 14 so as to confront the emitter electrode 4 with the gate electrode 5 between them. In the same manner as the pressure sensor shown in FIGS. 1 to 4, the pressure sensor having the Si substrate 1 configured as described above is used while the emitter electrode 4 is biased to be negative and the gate electrode 5 and the anode electrode 6 to be positive. In the embodiment, since the end faces of the comb-like emitter electrode 4 are geometrically equivalent to each other with respect to the gate electrode, the current densities of the end faces are equal to each other. This enables the threshold voltage of the field emission to be substantially constant, thereby realizing a sensor of an excellent resolution.

[Embodiment 2]

Figure 6:
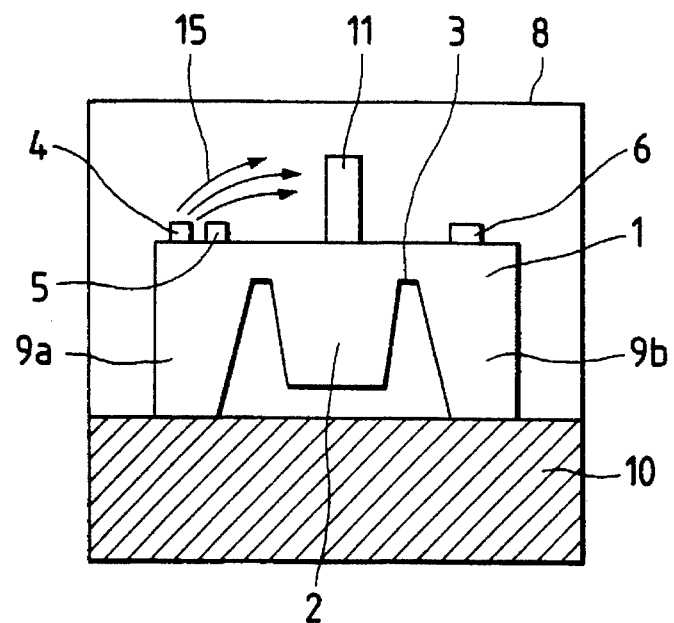
FIG. 6 is a section view showing the configuration of a pressure sensor according to Embodiment 2 of the invention.
Figure 7:
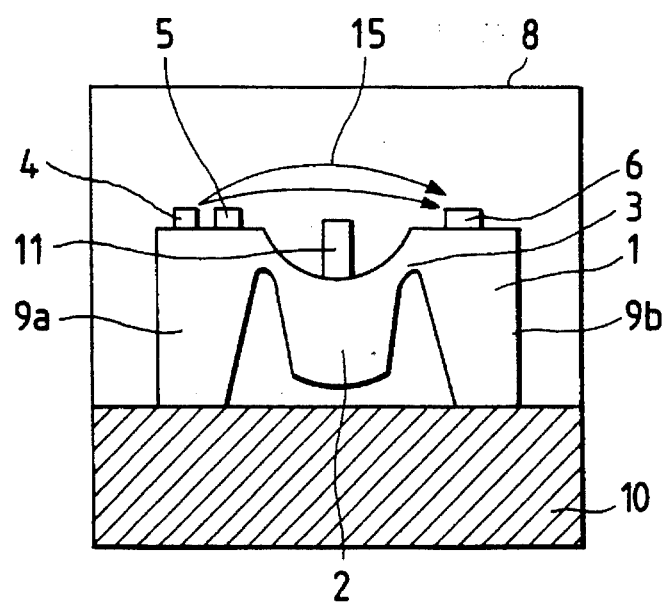
FIG. 7 is a section view showing a state in which a pressure due to an acceleration is applied to the pressure sensor.

FIG. 6 is a section view showing the configuration of a pressure sensor of Embodiment 2 of the invention. In the figure, the same parts as those of the pressure sensor of Embodiment 1 shown in FIG. 1 are designated by the same reference numerals, and their description is omitted. Also the pressure sensor of the embodiment is a pressure sensor of the acceleration measuring type same as that of the pressure sensor of Embodiment 1, but is different therefrom in arrangement of electrodes. Specifically, the electron emission unit which consists of an emitter electrode 4 and a gate electrode 5 disposed in the vicinity thereof is formed on a thick portion 9a in the one side of an Si substrate 1, and an anode electrode 6 which functions as the electron absorption unit is formed on a thick portion 9b in the other side in such a manner that these units confront each other. On a movable unit 2 located between the thick portions 9a and 9b, disposed is an aluminum shielding wall 11 which is cylindrical and has a height of about 10 μm.

In the same manner as the pressure sensor of Embodiment 1, the thus configured pressure sensor is used while the emitter electrode 4 is biased to be negative and the gate electrode 5 and the anode electrode 6 to be positive. When the gate voltage applied to the gate electrode 5 exceeds the threshold and the potential difference between the emitter electrode 4 and the gate electrode 5 reaches a predetermined value, electrons 15 begin to be emitted from the emitter electrode 4. In the embodiment, the shielding wall 11 (barrier and control means) is disposed on the movable unit 2 located between the emitter electrode 4 and the anode electrode 6. In the state where no acceleration is applied, therefore, the emitted electrons 15 are blocked by the shielding wall 11 from reaching the anode electrode 6 so that the anode current is not detected. When acceleration is applied under this state and a pressure G acts on the sensor, the movable unit 2 is depressed downward in accordance with the deflection (distortion) of a supporting unit 3, whereby also the shielding wall 11 is displaced. This causes the path of the electrons 15 to be opened, so that the emitted electrons 15 reach the anode electrode 6, thereby enabling the anode current to be detected. In the embodiment, the number of the emitted electrons 15 which are absorbed by the anode electrode 6 increases in accordance with the magnitude of the acceleration, and therefore the acceleration can be obtained by converting the rate of change of the anode current.

[Embodiment 3]

Figure 8:
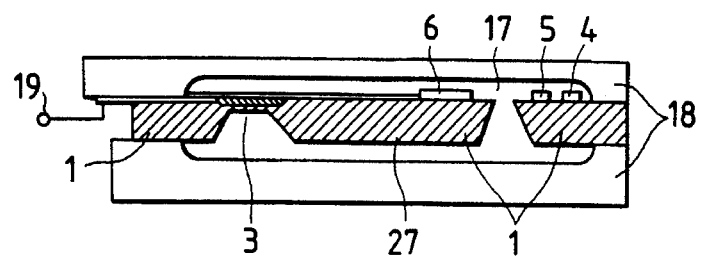
FIG. 8 is a section view showing the configuration of a pressure sensor according to Embodiment 3 of the invention.
Figure 9:
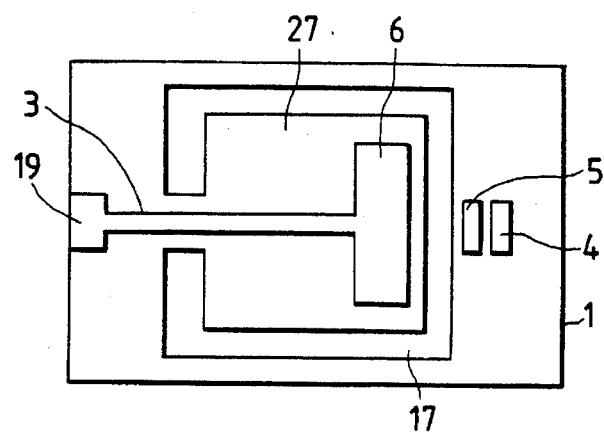
FIG. 9 is a plan view of the pressure sensor.

FIG. 8 is a section view showing the configuration of a pressure sensor of Embodiment 3 of the invention, and FIG. 9 is a plan view of the sensor. In the figures, the same parts as those of the pressure sensor of Embodiment 1 shown in FIG. 1 are designated by the same reference numerals, and their description is omitted. The pressure sensor is different from that of Embodiment 1 in that the movable unit is constructed as a one-end-supported movable unit (cantilever) 27 which projects in a beam-like manner from the thick portion of an Si substrate 1. In the pressure sensor, an anode electrode 6 is formed on the one-end- supported movable unit 27. In contrast, a gate electrode 5 and an emitter electrode 4 are formed in this sequence on a portion of the Si substrate 1 which opposes the one-end- supported movable unit 27 with an air gap 17 therebetween. The Si substrate 1 on which these electrodes are formed is fusion-bonded to a glass cover 18, thereby constituting the pressure sensor of the embodiment.

In the same manner as the pressure sensors of Embodiments 1 and 2, the thus configured pressure sensor is used while the emitter electrode 4 is biased to be negative and the gate electrode 5 and the anode electrode 6 to be positive. When a voltage higher than the threshold is applied to the gate electrode 5, electrons are emitted from the emitter electrode 4 and then captured by the anode electrode 6, so that the anode current is output through a pad 19. When the one-end-supported movable unit 27 is displaced downward by a pressure due to acceleration, the emitted electrons fly over the anode electrode 6 which is displaced downward, so that they can hardly be captured by the anode electrode 6. Therefore, the anode current output from the pad 19 changes (decreases) in level in accordance with the magnitude of the inclination of the anode electrode 6, or the magnitude of the pressure acting on the one-end- supported movable unit 27 functioning as the control means which displaces to move the anode electrode 6 and controls the electron capturing efficiency of the anode electrode 6, thereby enabling the acceleration to be measured from the rate of change of the anode current. Therefore, the pressure sensor can attain the same effects as the pressure sensor of Embodiment 1.

[Embodiment 4]

Figure 10:
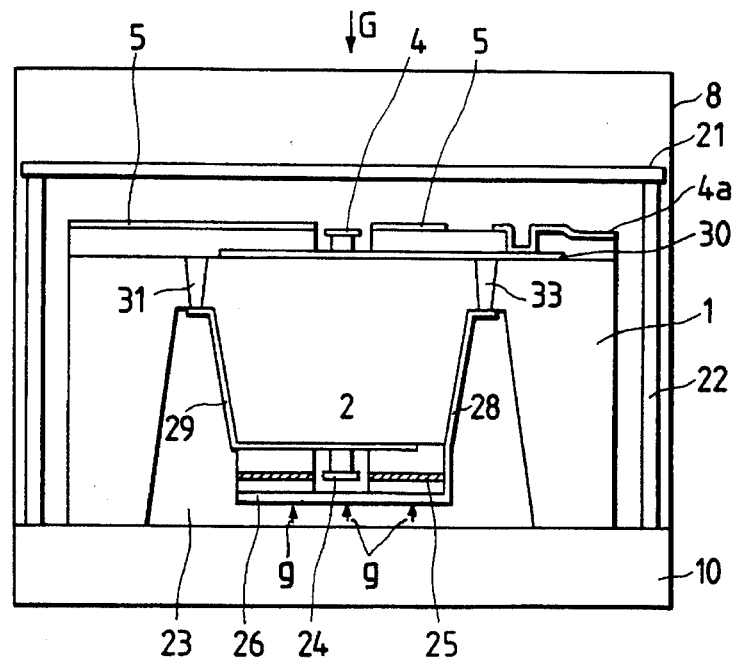
FIG. 10 is a section view showing the configuration of a pressure sensor according to Embodiment 4 of the invention.
Figure 11:
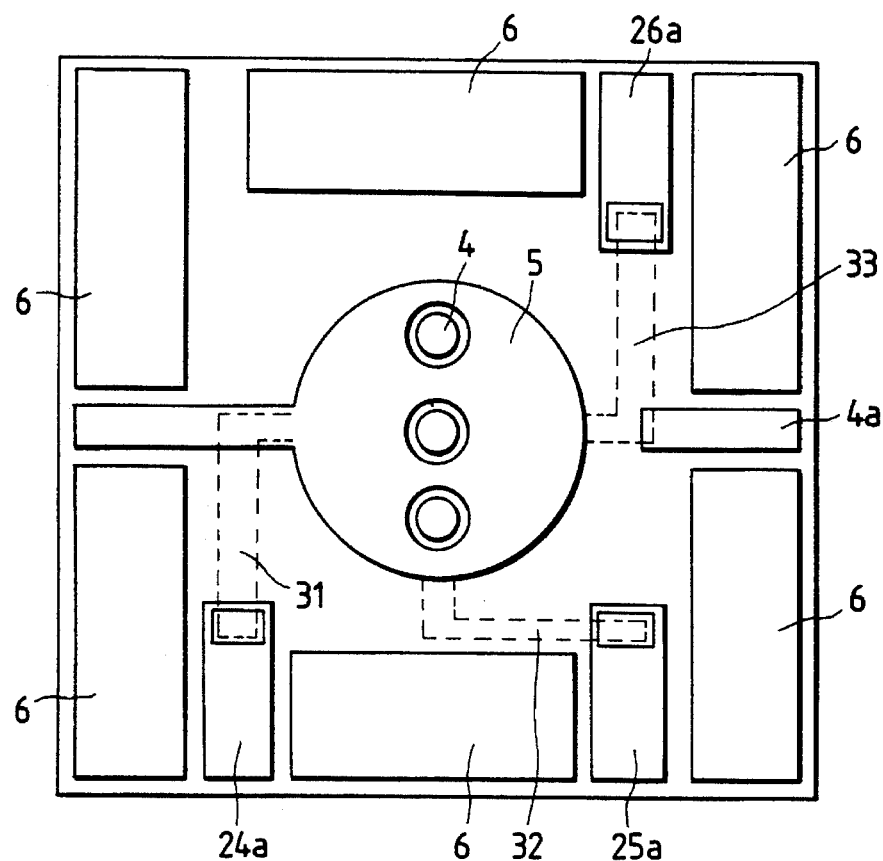
FIG. 11 is a plan view of the pressure sensor.

FIG. 10 is a section view showing the configuration of a pressure sensor of Embodiment 4 of the invention, and FIG. 11 is a plan view of the sensor. In the figures, the same parts as those of the pressure sensor of Embodiment 1 shown in FIG. 1 are designated by the same reference numerals, and their description is omitted. The pressure sensor of the embodiment is different from that of Embodiment 1 in that a second electron emission unit and a second electron absorption unit are formed on the back of a movable unit 2 and that an upper electrode having a surface area substantially same as that of the Si substrate 1 is disposed above the Si substrate 1 so as to oppose thereto. More specifically, a lower emitter electrode 24 which is symmetric in shape with an emitter electrode 4 formed on the surface of the movable unit 2 is formed on the back thereof, and a lower gate electrode 25 is disposed in the vicinity of the lower emitter electrode 24. In opposition to the second electron emission unit which consists of the lower emitter electrode 24 and the lower gate electrode 25, a lower anode electrode 26 which functions as the second electron absorption unit is formed so as to cover the lower portion of the lower emitter electrode 24. The lower emitter electrode 24 is connected through a lead conductor 29 and a diffusion conductor layer 31 to a leadout electrode 24a formed on the Si substrate 1. The lower gate electrode 25 is connected through a lead conductor (not shown) and a diffusion conductor layer 32 to a leadout electrode 25a formed on the Si substrate 1, and the lower anode electrode 26 is connected through a lead conductor 28 and a diffusion conductor layer 33 to a leadout electrode 26a formed on the Si substrate 1. The emitter electrode 4 is connected through a lead conductor 30 to a leadout electrode 4a formed on an end portion of the Si substrate 1. The lower space of the Si substrate 1 wherein the second electron emission unit and the second electron absorption unit are formed is filled with oil 23. An upper electrode 21 having a surface area substantially same as that of the Si substrate 1 is supported by electrode supporting members 22 in such a manner that it is located above and opposed to the Si substrate 1.

In the thus configured pressure sensor, on the Si substrate 1, formed are the electron emission unit which is displaced together with the movable unit 2 that can be moved by a pressure, and the electron absorption unit which absorbs electrons emitted from the electron emission unit and outputs the anode current. In the same manner as the pressure sensor of Embodiment 1, therefore, the pressure is converted from the rate of change of the output anode current, to obtain the acceleration. In addition, in the pressure sensor of the embodiment, the second electron emission unit and the second electron absorption unit are formed on the back of the movable unit 2, and therefore the anode current which is output when a pressure due to acceleration acts on the movable unit can be increased and the rate of change of the anode current becomes remarkable, whereby the sensitivity of the pressure sensor can be improved. More specifically, when the pressure G due to acceleration is applied toward the surface of the Si substrate 1, the movable unit 2 is displaced. Therefore, the oil 23 filled in the lower space of the Si substrate 1 is compressed so that a lower pressure g is applied to the face of the lower anode electrode 26. The application of the lower pressure g causes the lower anode electrode 26 to be displaced toward the lower emitter electrode 24, and the lower emitter electrode 24 is displaced toward the lower anode electrode 26 in accordance with the displacement of the movable unit 2 due to the pressure G, resulting in that the distance between the lower emitter electrode 24 and the lower anode electrode 26 is shortened. Therefore, the number of the electrons which are absorbed by the lower anode electrode 26 increases and also the anode current increases.

In the pressure sensor of the embodiment, since the upper electrode 21 is disposed above the Si substrate 1, the operation check for judging whether the sensor operates correctly or not can easily be performed. More specifically, the upper electrode 21 and the electrode on the Si substrate 1 which consists of the emitter electrode 4, the gate electrode 5, the anode electrode 6, and the leadout electrodes 4a, 24a, 25a and 26a are used as large electrodes of an electrostatic capacity, respectively. When the same high potential is applied to both the large electrodes, a pressure G due to the electric field repulsion is generated so as to act on the surface of the Si substrate 1, whereby a change of the node current can be detected. Therefore, it is possible to judge the nondefective/defective of the sensor without requiring additional checking apparatus for this purpose.

[Embodiment 5]

Figure 12:
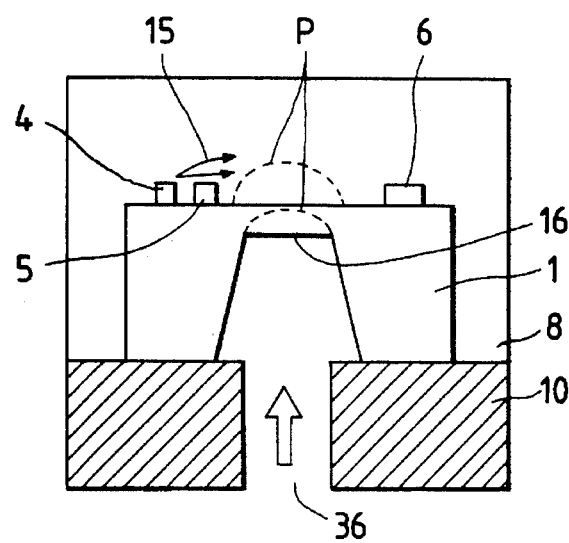
FIG. 12 is a section view showing the configuration of a pressure sensor according to Embodiment 5 of the invention.

FIG. 12 is a section view showing the configuration of a pressure sensor of Embodiment 5 of the invention. In the figure, the same parts as those of the pressure sensor of Embodiment 2 shown in FIG. 6 are designated by the same reference numerals, and their description is omitted. The pressure sensor is different from that of Embodiment 2 in that the center portion of the Si substrate 1 is formed as a thin diaphragm unit 16. In other words, the function of the shielding wall 11 which shields the path of emitted electrons in the pressure sensor of Embodiment 2 is realized by the diaphragm unit 16. Unlike the pressure sensors of Embodiments 1 to 4, the pressure sensor of the embodiment is used to measure the pressure of a fluid which enters from an introduction port 36 formed in a base 10.

In the pressure sensor having the above-mentioned configuration, under the state where the pressure of the fluid does not act on the diaphragm unit 16, electrons 15 emitted from an emitter electrode 4 are absorbed by an anode electrode 6 to be output as the anode current. When the pressure of the fluid increases to act on the diaphragm unit 16 and the diaphragm unit 16 is subjected to displacement (deformation) P, the path of the electrons 15 is blocked by the diaphragm unit 16. Therefore, the number of the electrons 15 which reach the anode electrode 6 is decreased so that also the anode current is decreased. In other words, the diaphragm unit 16 itself functions as the control means which deforms to block the electron path from the emitter electrode 4 to the anode electrode 6 so as to control the electron capturing efficiency of the anode electrode 6.

In this way, the pressure sensor of the embodiment can measure the pressure of a fluid by converting the rate of change of the obtained anode current into the pressure.

When the pressure sensor of the embodiment is used as a pressure sensor for an automobile, such as a carburetor intake air flow sensor, the withstand temperature and the withstand pressure can be increased to about 400° C. and 100 atm., respectively. When the pressure sensor of the embodiment is used as a brake oil sensor, the withstand pressure can be increased to 30 to 100 atm. The pressure sensor of the embodiment can remarkably be improved in property as compared with a prior art pressure sensor which uses the piezoresistance effect.

[Embodiment 6]

Figure 13:
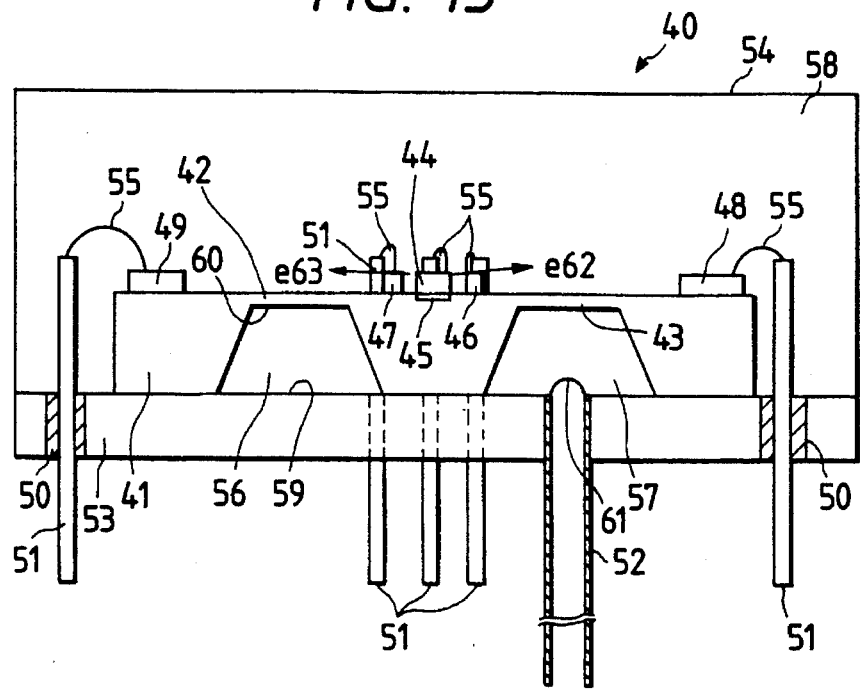
FIG. 13 is a section view showing the configuration of a temperature/pressure sensor device according to Embodiment 6 of the invention.
Figure 14:
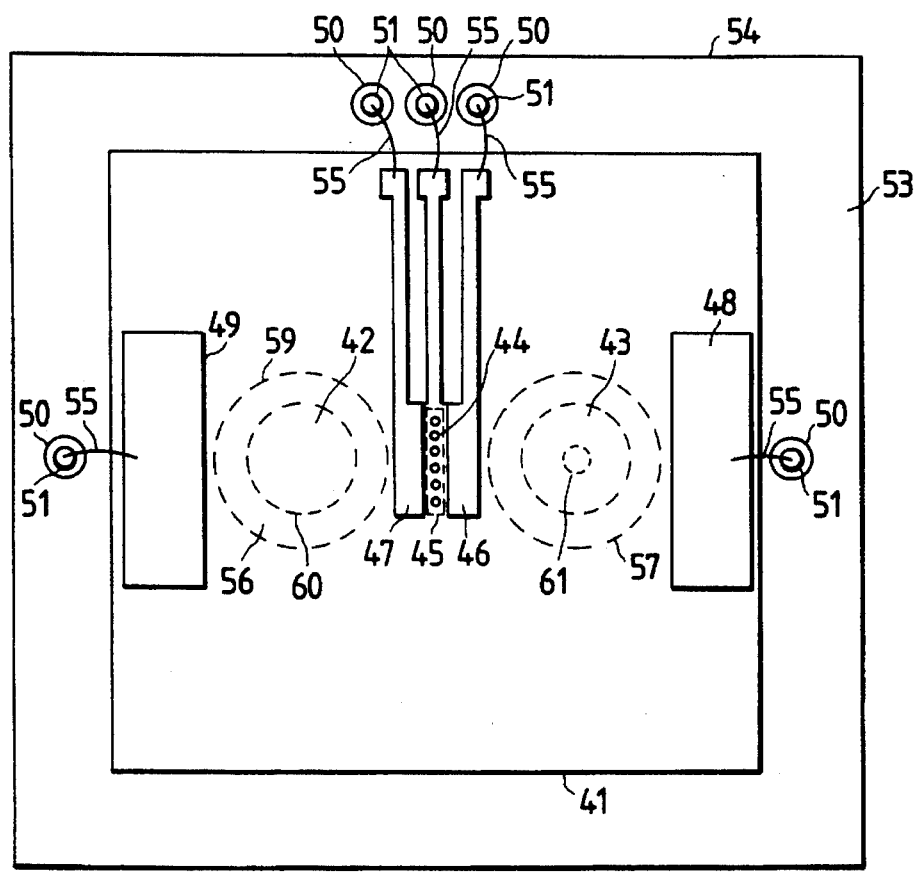
FIG. 14 is a plan view of the configuration of the temperature/pressure sensor device.

FIG. 13 is a section view showing the configuration of a temperature/pressure sensor device of Embodiment 6 of the invention, and FIG. 14 is a plan view of the sensor. The temperature/pressure sensor device of the embodiment is a vacuum microdevice in the form of a one-chip device wherein a pressure sensor (pressure sensing conversion device) and a temperature sensor (temperature sensing conversion device) are formed on the same substrate. The operation principle of the pressure sensor is basically identical with that of the pressure sensor of Embodiment 5. The temperature sensor is a pressure detection type temperature sensor in which a temperature change is converted into a pressure change to detect the anode current using the operation principle of the pressure sensor, and the temperature is measured from the detected anode current.

In the temperature/pressure sensor device 40 of the embodiment shown FIGS. 13 and 14, a cap 54 is hermetically adhered to a base 53, and the inner space of the cap is sealed under vacuum of $10^{-5}$ to $10^{-6}$ Torr. A sensor chip 41 which is a substrate made of Si comprises two diaphragm units (movable units), or a temperature sensing unit diaphragm 42 and a pressure sensing unit diaphragm 43. At the middle between the temperature sensing unit diaphragm 42 and the pressure sensing unit diaphragm 43, disposed is a cold cathode (emitter electrode) 44 which functions as a common electron emission unit. First and second gate electrodes 46 and 47 are disposed in the vicinity of the cold cathode. The cold cathode 44 consists of six electrodes which project upward from a cold cathode lower common electrode layer 45. A terminal 51 which is fixed to the base 53 via a glass seal 50 is electrically connected to the cold cathode lower common electrode layer 45 through an Au wire 55. The common electron emission unit comprising first and second anode electrodes 48 and 49 is disposed at a location which opposes the temperature sensing unit diaphragm 42 and the pressure sensing unit diaphragm 43. Also to the first and second anode electrodes 48 and 49, electrically connected is another terminal 51 which is fixed to the base 53 via the glass seal 50.

Figure 15:
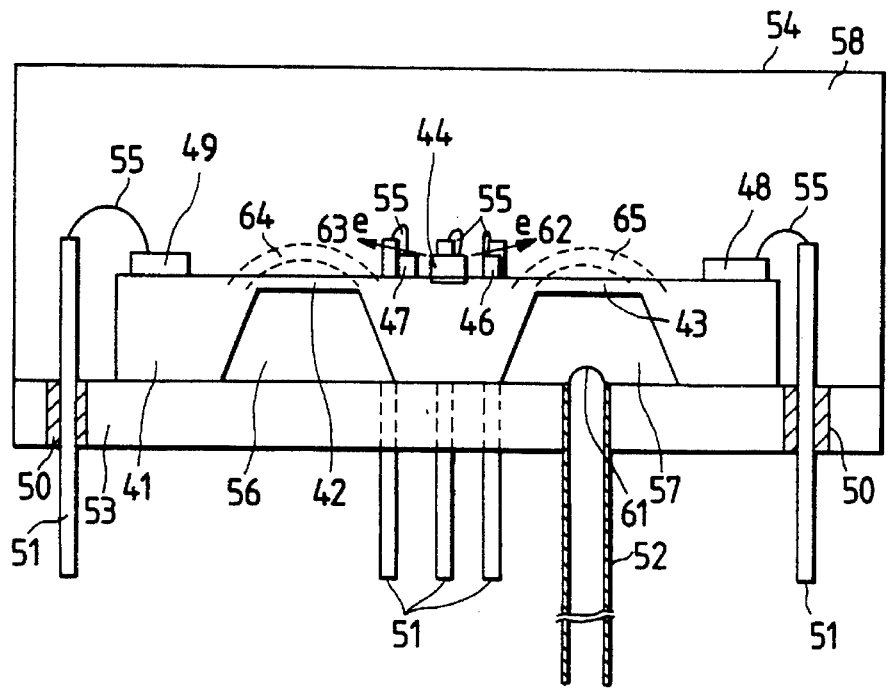
FIG. 15 is a section view showing an operation state of the temperature/pressure sensor device.

In the configuration, either of the temperature sensing unit diaphragm 42 side and the pressure sensing unit diaphragm 43 side basically function as a pressure sensor. More specifically, the electrodes are biased in such a manner that the cold cathode 44 is set to a negative potential and the first and second anode electrodes 48 and 49 and the first and second gate electrodes 46 and 47 are set to a positive potential. Under this bias state, when the voltage between the cold cathode 44 and the first and second gate electrodes 46 and 47 exceeds a predetermined threshold, the quantum-mechanical tunnel phenomenon occurs in a vacuum sealed space 58 inside the cap 54 so that electrons 62 and 63 are emitted from the cold cathode 44. The emitted electrons 62 and 63 are collected in accordance with the voltage applied to the first and second anode electrodes 48 and 49, and detected as the anode current. When the temperature sensing unit diaphragm 42 or the pressure sensing unit diaphragm 43 is swelled by an application of a pressure so as to have a state indicated in FIG. 15 as a deformed temperature sensing unit diaphragm 64 or a deformed pressure sensing unit diaphragm 65, the path from the cold cathode 44 to the first anode electrode 48 through the first gate electrode 46 or the path from the cold cathode 44 to the second anode electrode 49 through the second gate electrode 47 is partly or wholly blocked by the temperature sensing unit diaphragm 42 or the pressure sensing unit diaphragm 43. This causes the electron capturing efficiency of the first anode electrode 48 or the second anode electrode 49 to be changed, whereby the anode current from the first anode electrode 48 or the second anode electrode 49 is changed. In this case, the deformation amount of the temperature sensing unit diaphragm 42 or the pressure sensing unit diaphragm 43 is defined by the pressure applied to the temperature sensing unit diaphragm 42 or the pressure sensing unit diaphragm 43, and the degree of blocking the path from the first gate electrode 46 to the first anode electrode 48 or the path from the second gate electrode 47 to the second anode electrode 49 is defined by the deformation amount of the temperature sensing unit diaphragm 42 or the pressure sensing unit diaphragm 43. In other words, the temperature sensing unit diaphragm 42 and the pressure sensing unit diaphragm 43 function as barrier layers which operate in response to a pressure change, and they themselves are control means which deform to control the electron capturing efficiencies (anode currents) of the first anode electrode 48 and the second anode electrode 49. Accordingly, the magnitude of the pressure applied to the temperature sensing unit diaphragm 42 or the pressure sensing unit diaphragm 43 can be measured from the anode current which is output from the first anode electrode 48 or the second anode electrode 49.

Furthermore, minute spaces having a truncated conical shape are formed under the temperature sensing unit diaphragm 42 and the pressure sensing unit diaphragm 43, respectively. One of the two spaces is a gas filled unit 56 into which a slight amount of a gas is hermetically filled, and the other of the spaces is a minute space 57 to which an introduction pipe 52 is connected through an introduction port 61. A pressure can be applied to the pressure sensing unit diaphragm 43 through the introduction pipe 52 and the minute space 57. The pressure sensing unit diaphragm 43 can be deformed by the applied pressure. When changes in level of the anode current detected from the anode electrode 48 at the application of predetermined pressures are previously obtained, it is possible to convert an anode current detected during a pressure measurement into a pressure. In other words, the pressure sensing unit diaphragm 43 side functions as a pressure sensor.

On the other hand, the gas filled unit 56 is filled with argon gas. The gas filled in the unit expands or contracts in response to a temperature change in accordance with Boyle-Charle's law expressed by the following equation, and the expansion or contraction is applied in the form of a pressure change to the temperature sensing unit diaphragm 42:

$$pv = nRT$$

where v: volume of the gas filled unit 56 (liter), p: pressure (arm.), n: number of moles of the filled gas, R: gas constant, and T: absolute temperature (K).

The pressure applied to the temperature sensing unit diaphragm 42 is proportion to the absolute temperature.

In other words, when the temperature rises, the gas in the gas filled unit 56 is disposed to expand so that the internal pressure of the space is increased, and the increased pressure acts on the temperature sensing unit diaphragm 42. As a result, the temperature sensing unit diaphragm 42 is largely deformed to cause the anode current output from the second anode electrode 49 to be decreased. In contrast, when the temperature lowers, the gas in the gas filled unit 56 is disposed to contract so that the internal pressure of the space is decreased, and the decreased pressure acts on the temperature sensing unit diaphragm 42. If a gas is filled into the gas filled unit 56 so that a predetermined pressure is attained at a given temperature, therefore, it is possible to measure the temperature on the basis of this state from the change in level of the anode current output from the second anode electrode 49.

In the temperature/pressure sensor device 40 of the embodiment, therefore, the volume of the gas filled unit 56 is obtained in the procedure described below, and the amount of the gas filled in the gas filled unit 56 is defined and the normal condition is set. More specifically, the volume V of the truncated conical gas filled unit 56 can be obtained from the following equation when the height is indicated by h, the inner diameter in the side of a lower face 59 by $r_1$, and the inner diameter in the side of an upper face 60 by $r_2$:

$$\begin{aligned} V &= \pi h(r_1^2 + r_1 r_2 + r_2^2)/3 \\ &= \pi h(a^2 + b^2/3)/4 \end{aligned}$$

where $a = r_1 + r_2$ and $b = r_1 - r_2$.

When the height h of the gas filled unit 56 is 270 μm, the inner diameter $r_2$ in the side of the upper face is 0.8 μm, and the inner diameter $r_1$ in the side of the lower face is 1.0 μm, the volume V is obtained as about $7 \times 10^{-13}$ liters from the above equation.

From Boyle-Charle's law mentioned above, it will be noted that the gas filled unit 56 can be set so as to apply a pressure of 0.01 atm. to the temperature sensing unit diaphragm 42 at a temperature of 300 K, by filling a gas of a mole number (n) of about $2.8 \times 10^{-16}$ moles in the gas filled unit 56. In this case, when the temperature is raised to 800 K, the gas filled unit 56 applies a pressure of about 0.026 atm. to the temperature sensing unit diaphragm 42. When anode currents output from the second anode electrode 49 when the gas filled unit 56 applies pressures of from 0.01 atm. to 0.026 atm. are previously obtained, therefore, the temperature can be obtained by converting an anode current detected in the temperature measuring process into a temperature. In other words, the temperature sensing unit diaphragm 42 side functions as a temperature sensor. In the view points of the secular stability and the permeability, preferably, an inert gas such as argon gas having a higher molecular weight may be used as the gas to be filled in the gas filled unit 56.

As described above, in the temperature/pressure sensor device 40 of the embodiment, the pressure sensing unit diaphragm 43 side functions as a pressure sensor, and the temperature sensing unit diaphragm 42 side functions as a temperature sensor. According to the embodiment, therefore, a single temperature/pressure sensor device can detect both the temperature and the pressure. Since an anode current indicating the temperature or the pressure can be changed largely in accordance with a pressure applied to the respective the temperature sensing unit diaphragm 42 or pressure sensing unit diaphragm 43, the sensor of the embodiment has a high sensitivity and a high reliability. Furthermore, since the temperature/pressure sensor device 40 of the embodiment utilizes the field emission, it can be used in an atmosphere of radioactive-ray, high temperature or high pressure, and has an excellent environmental resistance.

Since the cold cathode is commonly used in the pressure sensor side and the temperature sensor side, the circuit configuration or the like can be simplified. Moreover, the basic configuration of the pressure sensor side is the same as that of the temperature sensor side, and therefore the production process of the sensor and the configuration of the system for detecting anode currents can be simplified. This allows a temperature/pressure sensor device of a high reliability to be economically produced. Furthermore, the basic configuration of the pressure sensor side is the same as that of the temperature sensor side, the data acquisition for converting an anode current into a temperature in the temperature sensor side may be conducted on data which are measured while changing the level of the pressure applied to the pressure sensor.

[Embodiment 7]

Figure 16:
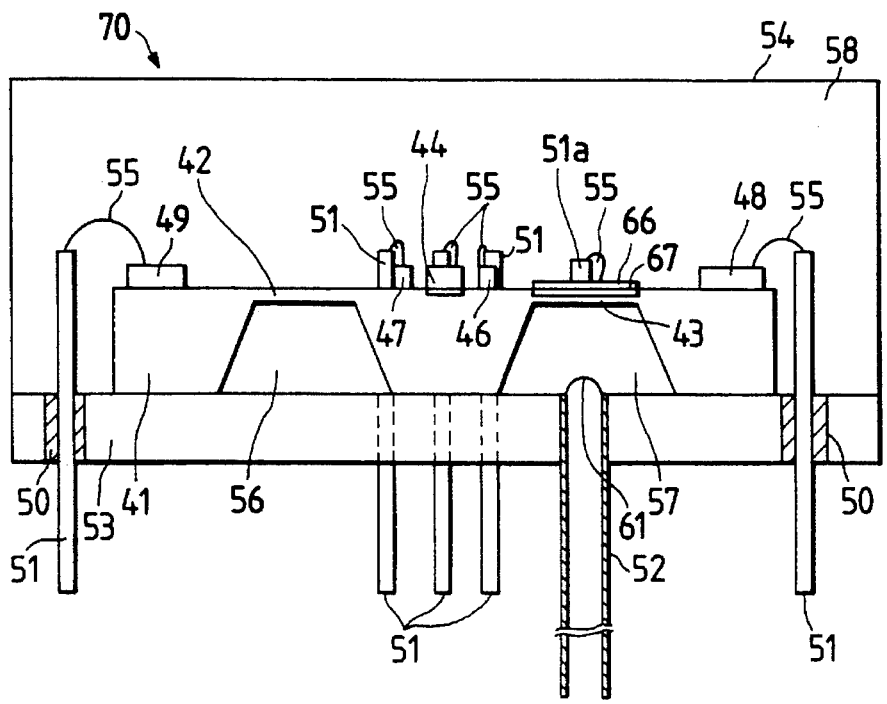
FIG. 16 is a section view showing the configuration of a temperature/pressure sensor device according to Embodiment 7 of the invention.

FIG. 16 is a section view showing the configuration of a temperature/pressure sensor device of Embodiment 7 of the invention. In the same manner as the temperature/pressure sensor device of Embodiment 6, also in the temperature/pressure sensor device of the embodiment, a pressure sensor and a temperature sensor are formed on the same substrate. The temperature/pressure sensor device of the embodiment is characterized in the configuration of the pressure sensing unit diaphragm side, and the other portions of the sensor are identical in configuration with those of the temperature/pressure sensor device of Embodiment 6. Accordingly, the common portions are designated by the same reference numerals, and their detailed description is omitted.

Also in the temperature/pressure sensor device 70 of the embodiment shown in FIG. 16, a sensor chip 41 which is a substrate made of Si comprises a temperature sensing unit diaphragm 42 and a pressure sensing unit diaphragm 43. At the middle between these sensing unit diaphragms, disposed is a cold cathode 44 which functions as the electron emission unit. The electron emission unit comprises first and second gate electrodes 46 and 47 which are disposed in the vicinity of the cold cathode 44. First and second anode electrodes 48 and 49 are disposed at locations which oppose the temperature sensing unit diaphragm 42 and the pressure sensing unit diaphragm 43, respectively.

In the configuration, either of the temperature sensing unit diaphragm 42 side and the pressure sensing unit diaphragm 43 side principally function as a pressure sensor. In the temperature sensing unit diaphragm 42 side, a gas filled unit 56 into which a slight amount of a gas is hermetically filled is formed at the back of the diaphragm. Accordingly, the temperature sensing unit diaphragm 42 side functions as a temperature sensor in the same manner as the pressure/temperature sensor of Embodiment 6.

In the temperature/pressure sensor device 70 of the embodiment, an auxiliary anode pattern (not shown) and an auxiliary anode leadout diffusion layer 67 are formed. The auxiliary anode pattern is electrically connected to a terminal 51 at the periphery of the sensor chip 41 through an Au wire 55. To the auxiliary anode leadout diffusion layer 67, electrically connected is an auxiliary anode electrode 66 which is formed on the surface of the pressure sensing unit diaphragm 43. The auxiliary anode leadout diffusion layer 67 is positioned at the circumference of the electrode 66, and is formed as an impurity diffusion layer in the Si substrate of the sensor chip 41 so that it does not hinder the pressure sensing unit diaphragm 43 from being deformed.

Figure 17:
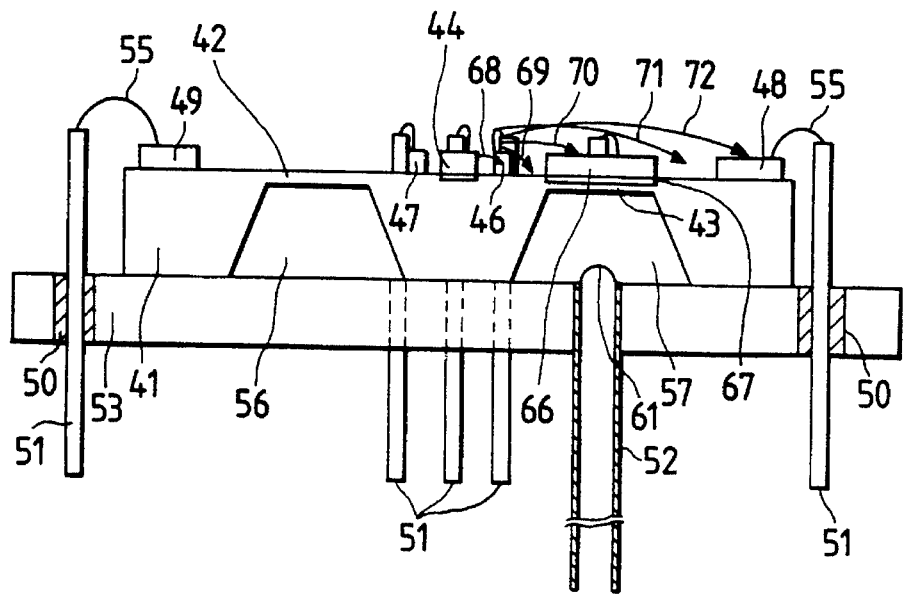
FIG. 17 is a diagram illustrating the effect of the temperature/pressure sensor device.

Also in the temperature/pressure sensor device 70 of the embodiment, as shown in FIG. 17, electrons 68 to 72 are emitted from the cold cathode 44. Generally, some of the emitted electrons, such as the emitted electrons 68, 69, 70 and 71 fail to be captured by the first anode electrode 48. To comply with this, in the temperature/pressure sensor device 70 of the embodiment, the auxiliary anode electrode 66 is disposed between the cold cathode 44 and the first anode electrode 48, so that the electrons 68 to 72 emitted from the cold cathode 44 are attracted by the electric field formed by the auxiliary anode electrode 66 and directed toward the first anode electrode 48, thereby improving the electron capturing efficiency of the first anode electrode 48. More specifically, when the auxiliary anode electrode 66 is set to a positive potential of an appropriate level, the electrons 68 to 72 emitted from the cold cathode 44 are attracted toward the auxiliary anode electrode 66 under the condition that the pressure sensing unit diaphragm 43 is not deformed as shown in FIG. 17, resulting in that most of the emitted electrons 68 to 72 are captured by the first anode electrode 48. Under the normal condition or when the pressure sensing unit diaphragm 43 is not deformed, accordingly, the first anode electrode 48 can attain a higher electron capturing efficiency so that the sensor has a higher sensitivity.

Figure 18:
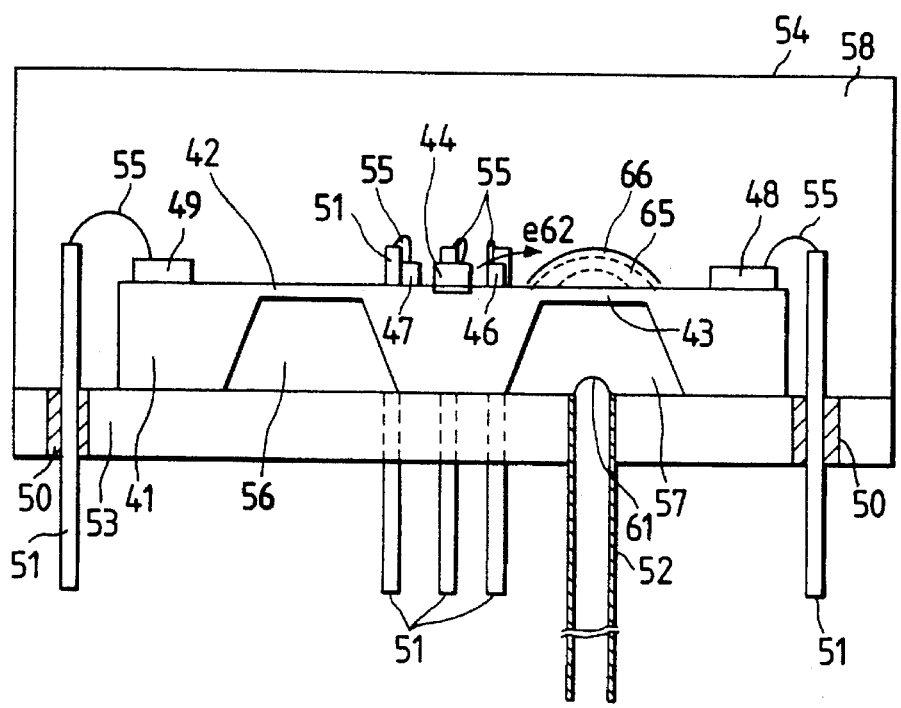
FIG. 18 is a section view showing an operation state of the temperature/pressure sensor device.

The temperature/pressure sensor device 70 shown in FIG. 17 is placed as it is in a high-temperature and high-vacuum apparatus, and measures the temperature and vacuum states of the apparatus. Therefore, the surfaces of the temperature sensing unit diaphragm 42 and the pressure sensing unit diaphragm 43 are not covered by a cap. Alternatively, as shown in FIG. 18, the sensor may be provided with a cap 54 and the space inside the cap may be made vacuous. FIG. 18 shows the state where the pressure sensing unit diaphragm 43 is deformed and the emitted electrons 62 are attracted toward the auxiliary anode electrode 66.

Figure 19:
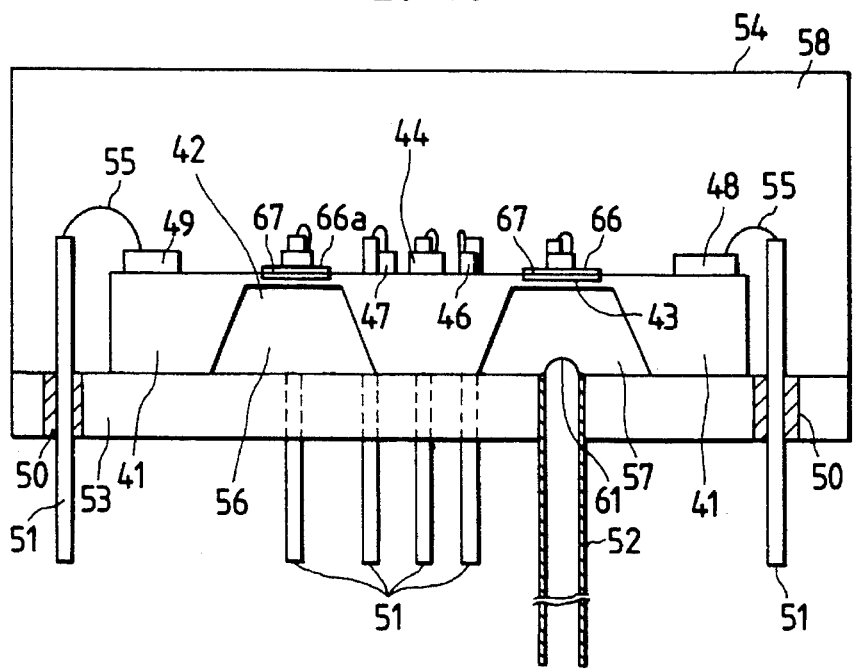
FIG. 19 is a section view showing the configuration of a temperature/pressure sensor device which is a modification of Embodiment 7 of the invention.
Figure 20:
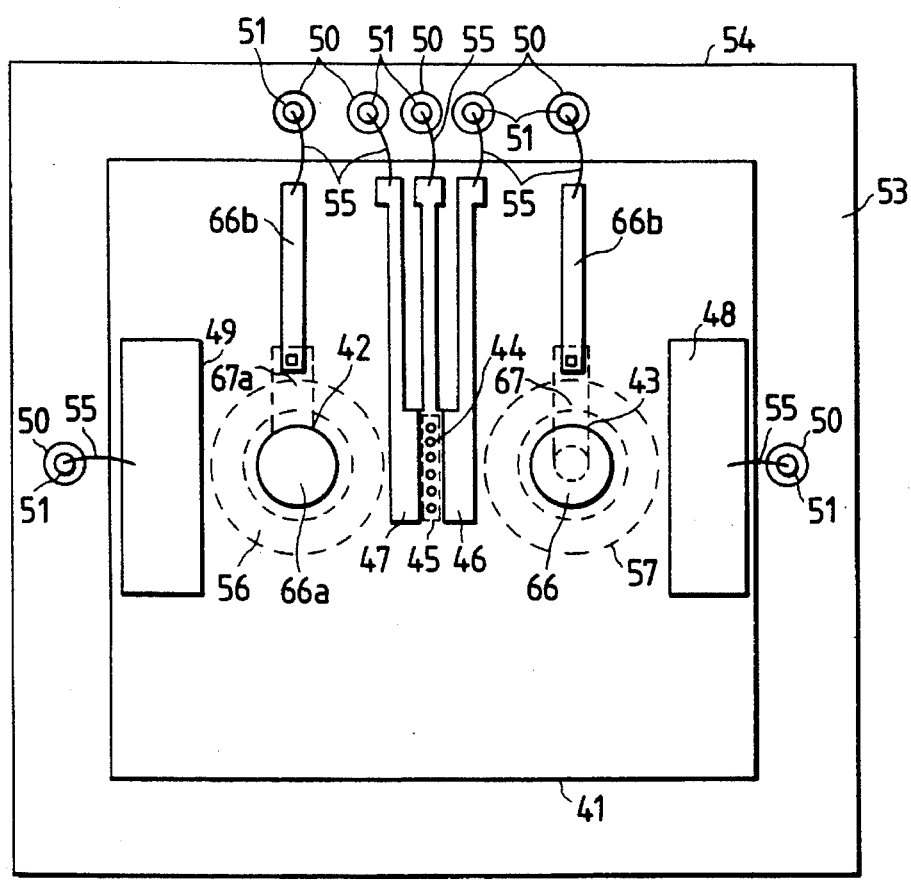
FIG. 20 is a plan view of the configuration of the temperature/pressure sensor device.

FIG. 19 is a section view of a temperature/pressure sensor device which is a modification of Embodiment 7, and FIG. 20 is a plan view of the sensor. As shown in the figures, in the pressure sensing unit diaphragm 43 side, an auxiliary anode pattern 66b which is electrically connected to a terminal 51 at the periphery of a sensor chip 41 through an Au wire 55, an auxiliary anode leadout diffusion layer 67, and an auxiliary anode electrode 66 may be formed. Also in the temperature sensing unit diaphragm 42 side, an auxiliary anode pattern 66b which is electrically connected to a terminal 51 at the periphery of the sensor chip 41 through an Au wire 55, the auxiliary anode leadout diffusion layer 67, and an auxiliary anode electrode 66a which is electrically connected to the auxiliary anode leadout diffusion layer 67 may be formed. According to the modification, also in the temperature sensing unit diaphragm 42, the temperature can be detected with an excellent sensitivity from the pressure which is applied to the diaphragm from the gas filled unit 56 on the basis of the temperature change. Furthermore, since the electrical connections between the temperature sensing unit diaphragm 42 and the pressure sensing unit diaphragm 43 and their periphery are conducted by the auxiliary anode leadout diffusion layers 67, the pressure sensing unit diaphragm 43 and the pressure sensing unit diaphragm 43 are not hindered from being deformed.

[Embodiment 8]

Figure 21:
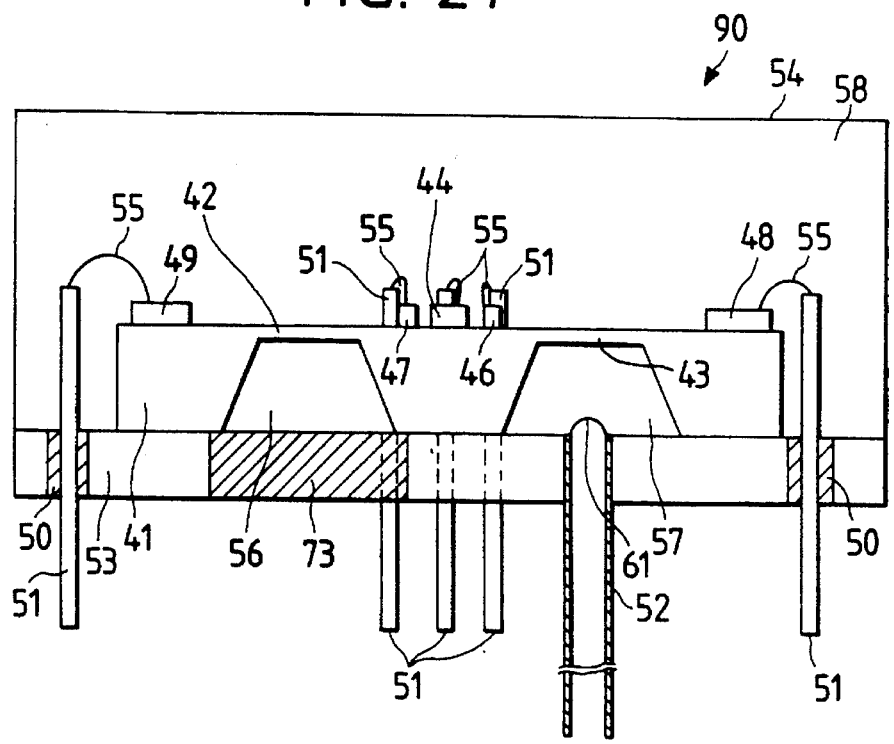
FIG. 21 is a section view showing the configuration of a temperature/pressure sensor device according to Embodiment 8 of the invention.

FIG. 21 is a section view showing the configuration of a temperature/pressure sensor device of Embodiment 8 of the invention. In the same manner as the temperature/pressure sensor device of Embodiment 6, also in the temperature/ pressure sensor device of the embodiment, a pressure sensor and a temperature sensor are formed on the same substrate. The temperature/pressure sensor device of the embodiment is characterized in the configuration of the temperature sensing unit diaphragm side, and the other potions of the sensor are identical in configuration with those of the temperature/pressure sensor device of Embodiment 6. Accordingly, the common portions are designated by the same reference numerals, and their detailed description is omitted.

Also in the temperature/pressure sensor device 90 of the embodiment shown in FIG. 21, a sensor chip 41 which is a substrate made of Si comprises a temperature sensing unit diaphragm 42 and a pressure sensing unit diaphragm 43. A cold cathode 44 is disposed at the middle between the temperature sensing unit diaphragm 42 and the pressure sensing unit diaphragm 43. First and second gate electrodes 46 and 47 are disposed in the vicinity of the cold cathode 44. First and second anode electrodes 48 and 49 are disposed at locations which oppose the temperature sensing unit diaphragm 42 and the pressure sensing unit diaphragm 43, respectively. Therefore, either of the temperature sensing unit diaphragm 42 side and the pressure sensing unit diaphragm 43 side principally function as a pressure sensor. In the temperature sensing unit diaphragm 42 side, a gas filled unit 56 into which a slight amount of a gas is hermetically filled is formed at the back of the diaphragm. Accordingly, the temperature sensing unit diaphragm 42 side functions as a temperature sensor in the same manner as the pressure/ temperature sensor of Embodiment 6.

In the temperature/pressure sensor device 90 of the embodiment, a heat conduction plate 73 made of a high thermal conductivity material such as copper, aluminum, beryllia, gold, silver or molybdenum is embedded in a base 53 supporting the back of the sensor chip 41 in which the pressure sensing unit diaphragm 43 and the gas filled unit 56 are formed. The embedded position of the heat conduction plate 73 corresponds to the back of the gas filled unit 56. The upper face of the heat conduction plate 73 constitutes the lower face 59 of the gas filled unit 56. The other portions of the sensor are identical in configuration with those of the temperature/pressure sensor device of Embodiment 6.

In the thus configured temperature/pressure sensor device 90, the provision of the heat conduction plate 73 in the base 53 enhances the heat conduction from the base 53 to the gas filled unit 56. Therefore, the gas in the gas filled unit 56 expands or contracts in response to the temperature change of the ambient with an excellent follow- up property, to change its pressure against the temperature sensing unit diaphragm 42, whereby the responsibility of the temperature/pressure sensor device 90 is improved.

Figure 22:
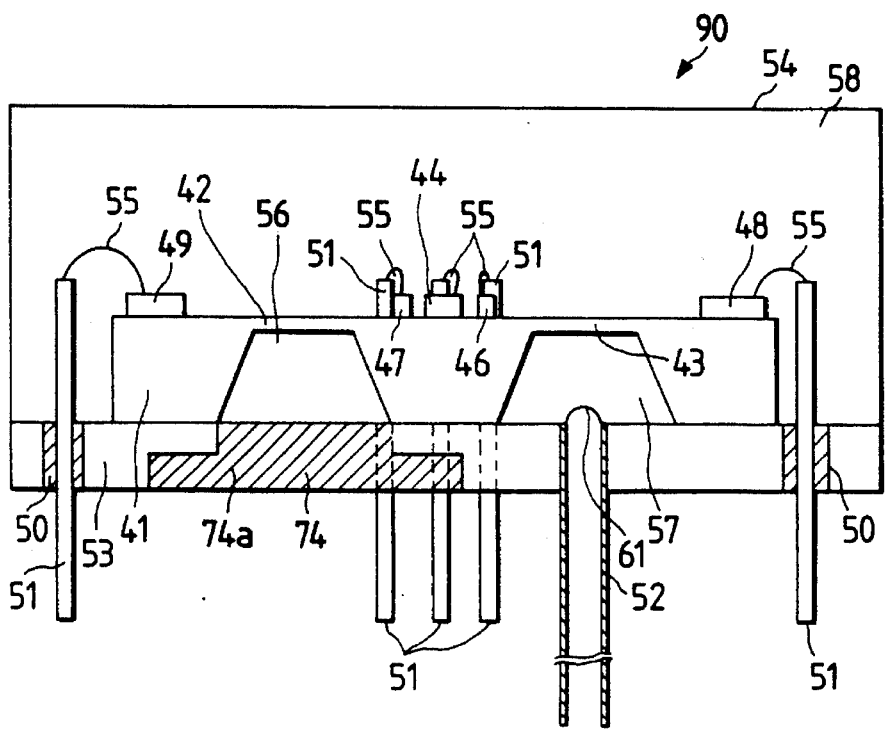
FIG. 22 is a section view showing the configuration of a temperature/pressure sensor device which is a modification of Embodiment 8 of the invention.

The shape of the heat conduction plate may be modified. For example, as indicated in FIG. 22 which shows a modification of the temperature/pressure sensor device of the embodiment, a heat conduction plate 74 having a flange 74a elongating in the back of the base 53 may be employed. In this modification, the heat conduction from the base 53 is enhanced so that the responsibility of the temperature/ pressure sensor device 90 is further improved.

As described above, in either of the temperature/pressure sensor devices of Embodiments 6 to 8, a temperature sensor of the temperature-pressure change type in which a temperature change is converted into a pressure change to be detected as a change in the anode current can be constituted, and the temperature sensor and a pressure sensor are formed on the same substrate, thereby enabling the temperature/ pressure sensor devices to measure both temperature and pressure. Accordingly, the temperature/pressure sensor devices are convenient to use.

Figure 23:
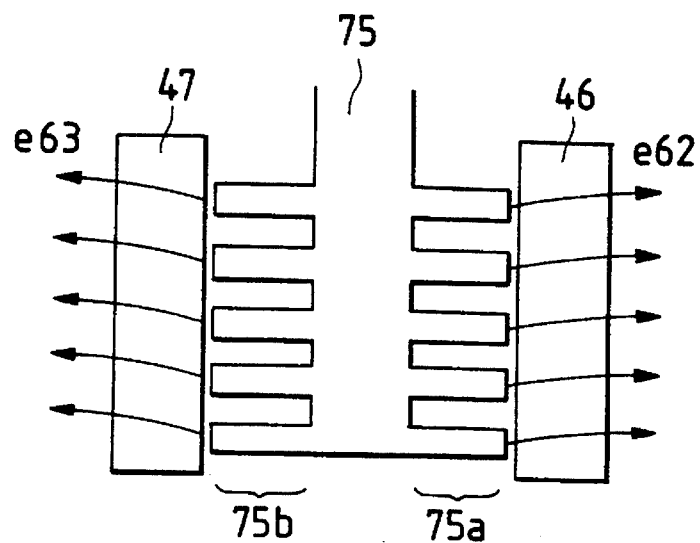
FIG. 23 is a plan view showing the configuration of a common type comb-like cold cathode unit which can be used as a common cold cathode for a temperature sensor side and a pressure sensor side in the temperature/pressure sensor devices according to Embodiments 6 to 8.
Figure 24:
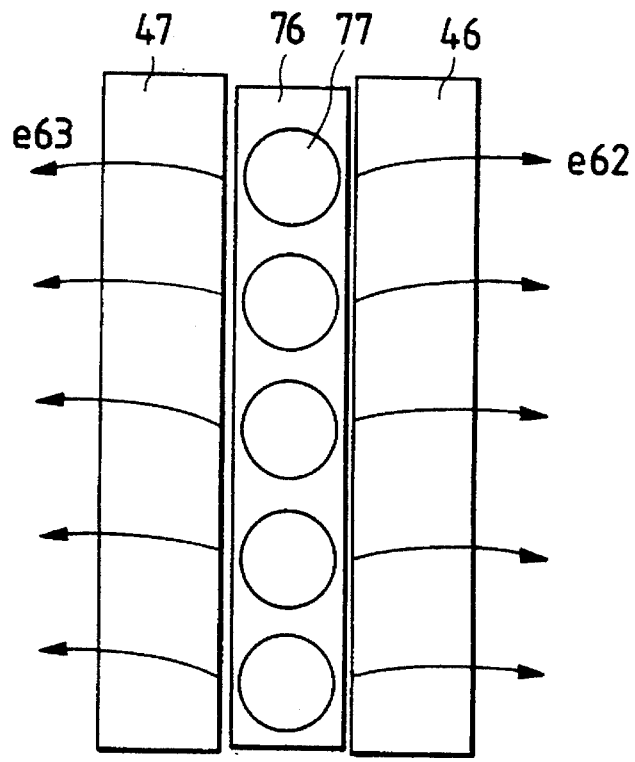
FIG. 24 is a plan view showing the configuration of a common type ring-like cold cathode unit which can be used as a common cold cathode for the temperature sensor side and the pressure sensor side in the temperature/pressure sensor devices according to Embodiments 6 to 8.
Figure 25:
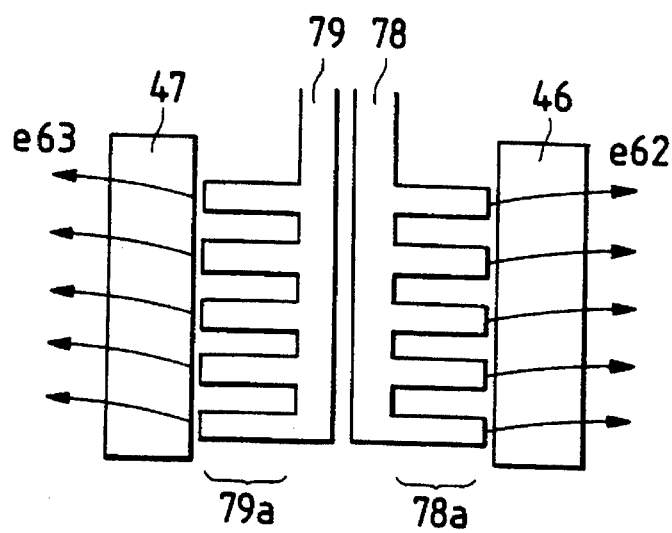
FIG. 25 is a plan view showing the configuration of isolate type comb-like cold cathode units which can be used as independent cold cathodes for the temperature sensor side and the pressure sensor side in the temperature/pressure sensor devices according to Embodiments 6 to 8.
Figure 26:
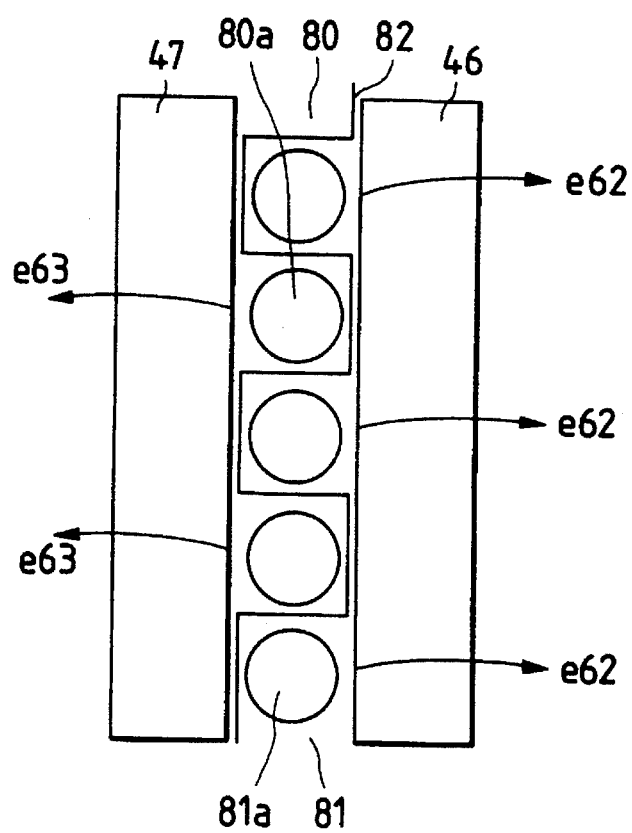
FIG. 26 is a plan view showing the configuration of isolate type ring-like cold cathode units which can be used as independent cold cathodes for the temperature sensor side and the pressure sensor side in the temperature/pressure sensor devices according to Embodiments 6 to 8.

All the temperature/pressure sensor devices of Embodiments 6 to 8 require an electron emission unit (cathode) corresponding to the temperature sensor side and the pressure sensor side. In the case where cold cathodes for the temperature sensor and pressure sensor sides are united, the cold cathode may have a configuration other than those employed in Embodiments 6 to 8. For example, one of configurations shown in FIGS. 23 and 24, namely, a common type comb-like cold cathode unit 75 or a common type ring- like cold cathode unit 76 may be used. As indicated in FIGS. 23 and 24 diagrammatically showing the positional relationships between the cold cathode and the first and second gate electrodes 46 and 47, the common type comb-like cold cathode unit 75 comprises a plurality of comb-like cold cathode portions 75a and 75b which project from a common base unit (circuit pattern) toward the first and second gate electrodes 46 and 47 (the first and second anode electrodes 48 and 49), and the common type ring-like cold cathode unit 76 comprises ring-like cold cathode portions 77 which protrude upward from a common base unit. In the case where the common type comb-like cold cathode unit 75 or the common type ring-like cold cathode unit 76 is used, a negative potential is applied through the common base unit to the comb-like cold cathode portions 75a and 75b or the ring-like cold cathode portions 77 so that the electrons 62 and 63 are emitted toward the first and second anode electrodes 48 and 49. In the case where cold cathodes for the temperature sensor and pressure sensor sides are configured independently from each other, the cold cathodes may have one of the configurations shown in FIGS. 25 and 26. In the configurations, isolate type comb-like cold cathode units 78 and 79 respectively comprise a plurality of comb-like cold cathode portions 78a and 79a which project from the corresponding common base units (circuit patterns) toward the first and second gate electrodes 46 and 47 (the first and second anode electrodes 48 and 49), and isolate type ring- like cold cathode units 80 and 81 respectively comprise ring-like cold cathode portions 80a and 81a which protrude upward from the common base units electrically isolated from each other by a separation line 82. In the case where the isolate type comb-like cold cathode units 78 and 79 or the isolate type ring-like cold cathode units 80 and 81 are used, a negative potential is applied through the corresponding common base units to the comb-like cold cathodes 78a and 79a or the ring-like cold cathodes 80a and 80b so that electrons 62 and 63 are emitted toward the first and second anode electrodes 48 and 49.

The temperature sensor side may be configured in a manner different from those described in Embodiments 6 to 8. When the configuration of one of the pressure sensors of Embodiments 1 to 5 is employed as the basic configuration, and temperature-pressure conversion means such as a gas filled unit which applies a pressure corresponding to the temperature to the movable unit such as the diaphragm unit is provided, a pressure detection type temperature sensor can be configured. In this case, a sensor in which the basic configuration of the pressure sensor side is the same as that of the temperature sensor side has an advantage that the production process of the sensor and the configuration of the system for detecting anode currents can be simplified. Alternatively, depending on the purpose or the like, a temperature/pressure sensor device may be configured in such a manner that the temperature sensor and pressure sensor sides having different basic configurations are formed on the same substrate.

[Embodiment 9]

Figure 27A:
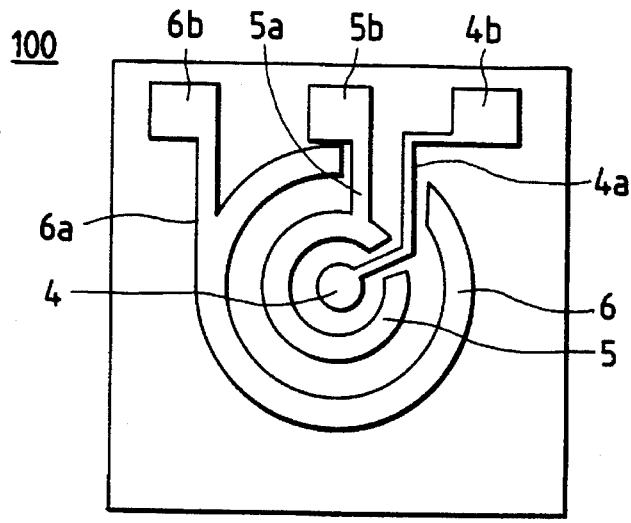
FIG. 27(a) is a plan view showing the configuration of an acceleration sensor of Embodiment 9 of the invention.
Figure 27B:
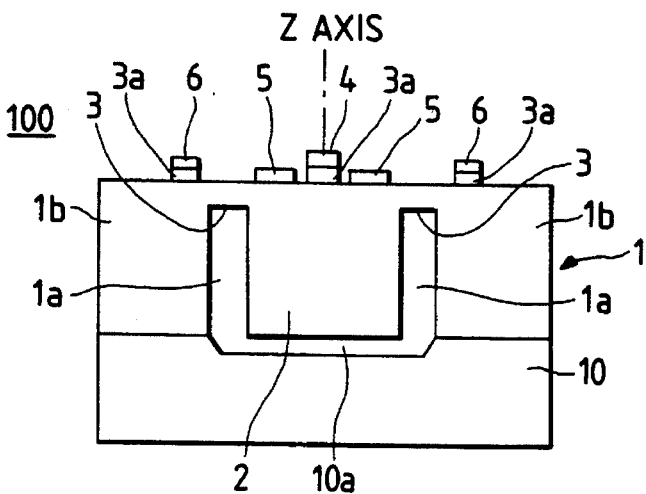
FIG. 27(b) is a section view of the acceleration sensor.

FIG. 27 shows an acceleration sensor of Embodiment 9 of the invention. The acceleration sensor comprises a peripheral fixed unit 1b and a center movable unit 2 which are separated from each other by an annular groove 1a that is formed in the back of an Si substrate 1 on a glass base 10. The acceleration sensor further comprises an emitter electrode 4 which is formed at the center of the surface of the Si substrate 1, an annular control electrode 5 which is formed so as to surround the emitter electrode 4, and an annular anode 6 which is formed on the surface of the fixed unit 1b so as to surround the control electrode 5. The emitter electrode 4, the control electrode 5 and the anode 6 are connected to pads 4b, 5b and 6b formed in an edge portion of the Si substrate 1 through leadout conductors 4a, 5a and 6a, respectively. The emitter electrode 4 and the control electrode 5 are formed on an insulating film 3a. The glass base 10 is joined to the Si substrate 1 by means of the anode bonding, and a recess 10a for restricting the vertical movement of the movable unit 2 is formed at the upper portion of the base 10.

In the acceleration sensor, the circular emitter electrode 4, the annular control electrode 5, and the annular anode 6 are concentrically arranged on the X-Y plane, and therefore cold electrons are isotropically emitted from the emitter electrode 4 located at the center, so that the current densities of all parts of the peripheral end face of the emitter electrode 4 are made equal to each other. Accordingly, the threshold of the field emission is substantially constant, whereby a sensor of an excellent resolution can be realized.

Figure 28:
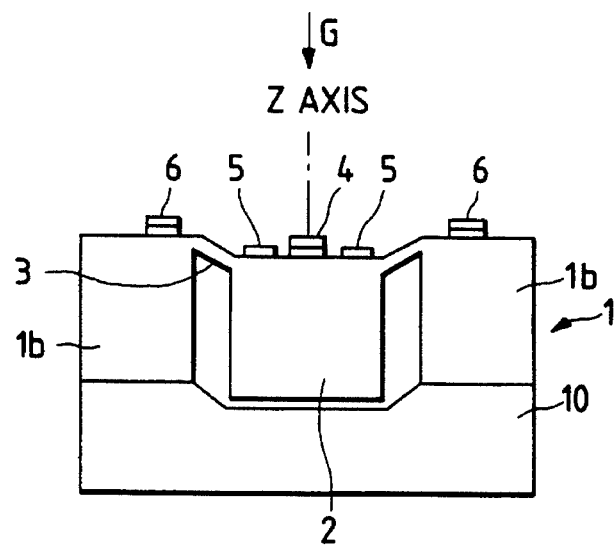
FIG. 28 is a section view showing the operation of the sensor according to Embodiment 9.

In the same manner as the embodiments described above, when an acceleration G in the Z-axis direction is applied as shown in FIG. 28, the movable unit 2 surrounded by a thin supporting unit 3 is displaced downward. This displacement changes the relative electric field distribution between the electron emission unit on the movable unit 2 and the electron collecting unit on the fixed unit 1b, whereby the electron reaching path toward the electron collecting unit is converged. Accordingly, the electron capturing efficiency is lowered, so that the magnitude of the acceleration is detected in the form of the reduction of the anode current. Also, the direction of the acceleration in the Z-axis direction can be detected by measuring the differential of the anode current.

Also the electrode arrangement in which electrodes are arranged in the manner opposite to that described above, namely, an annular emitter electrode is formed on the fixed unit 1b, an annular control electrode is formed inside the emitter electrode, and an anode is formed at the center of the movable unit 2 can attain the same effects.

[Embodiment 10]

Figure 29A:
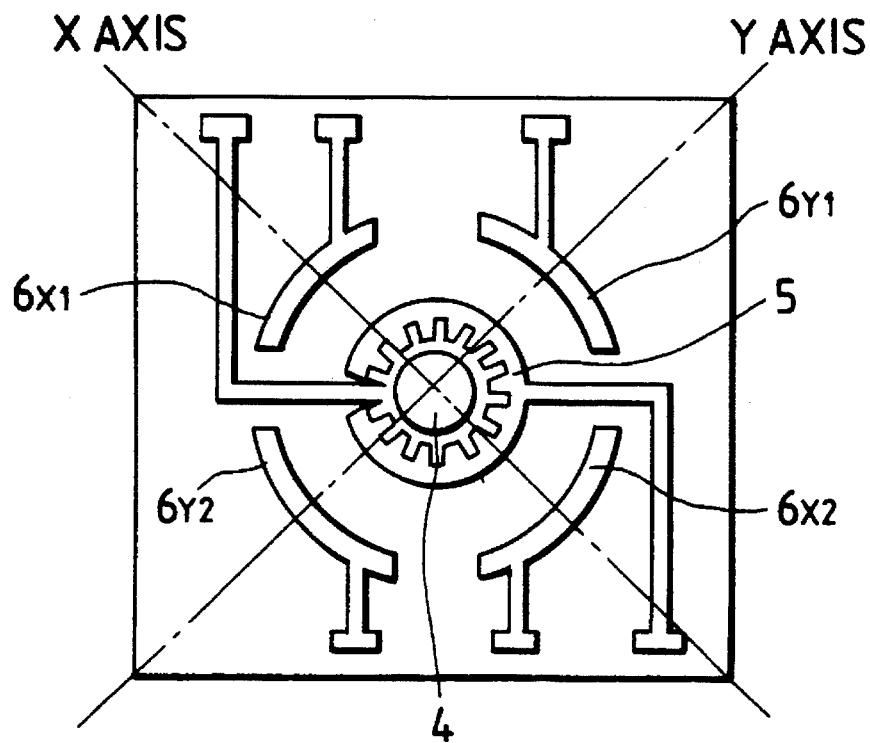
FIG. 29(a) is a plan view showing the configuration of an acceleration sensor according to Embodiment 10 of the invention.
Figure 29B:
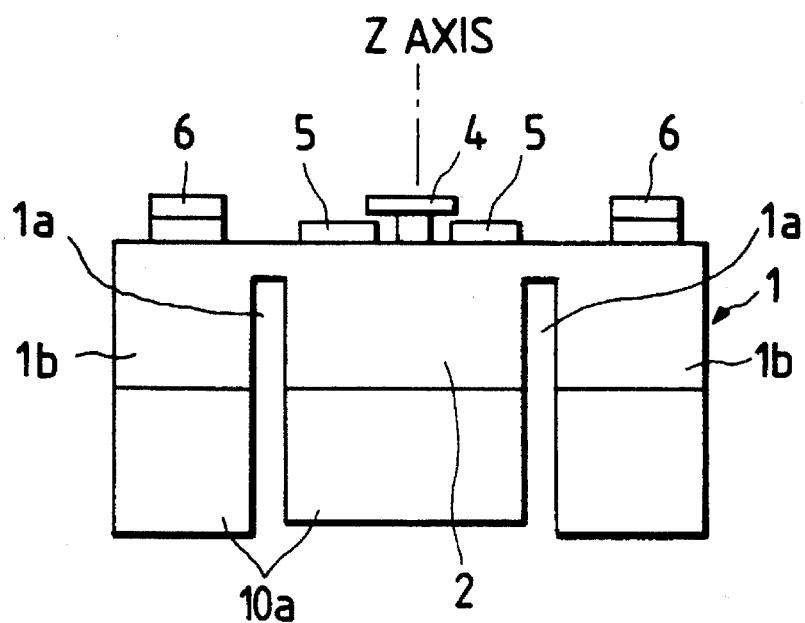
FIG. 29(b) is a section view of the acceleration sensor.

FIG. 29 shows an acceleration sensor of Embodiment 10 of the invention. The acceleration sensor is a sensor for detecting accelerations in the three-axis directions, and comprises an annular comb-like emitter electrode 4 which is formed at the center of a movable unit 2, an annular control electrode 5 which is formed so as to surround the emitter electrode 4, and four anodes $6_{x1}$, $6_{x2}$, $6_{y1}$ and $6_{y2}$ which have the same shape and are formed on a fixed unit 1b in the circumferential direction. The anodes $6_{x1}$ and $6_{x2}$ are on the X-axis shown in the figure, and the anodes $6_{y1}$ and $6_{y2}$ are on the Y-axis, so that the anodes $6_{x1}$, $6_{x2}$, $6_{y1}$ and $6_{y2}$ are rotationally symmetric about the emitter electrode 4 with a step of 90 deg. Glass portions 10a which function as weights are joined to the lower faces of the fixed unit 1b and the movable unit 2 of the sensor, respectively.

Figure 30A:
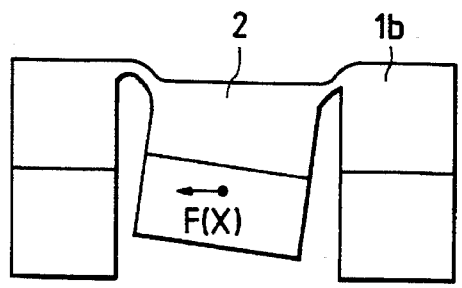
FIG. 30 is a plan view showing the operations of the sensor according to Embodiment 10.
Figure 30B:
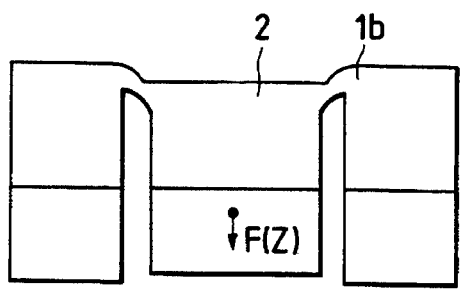

When an acceleration is applied only in the X-axis (or Y-axis) direction, for example, the movable unit 2 is displaced as shown in FIG. 30(a). This displacement causes the anode currents of the anodes $6_{x1}$ and $6_{x2}$ (or $6_{y1}$ and $6_{y2}$) to be decreased. Therefore, the magnitude of the acceleration in the X-axis (or Y-axis) direction can be measured by detecting a synthetic (addition) current of the anodes $6_{x1}$ and $6_{x2}$ (or $6_{y1}$ and $6_{y2}$). When an acceleration is applied only in the Z-axis direction, the movable unit 2 is displaced as shown in FIG. 30(b). This displacement causes the anode currents of all the anodes $6_{x1}$, $6_{x2}$, $6_{y1}$ and $6_{y2}$ to be decreased. Therefore, the magnitude of the acceleration in the Z-axis direction can be measured by synthesizing (adding) the currents of the anodes $6_{x1}$, $6_{x2}$, $6_{y1}$ and $6_{y2}$.

Figure 31:
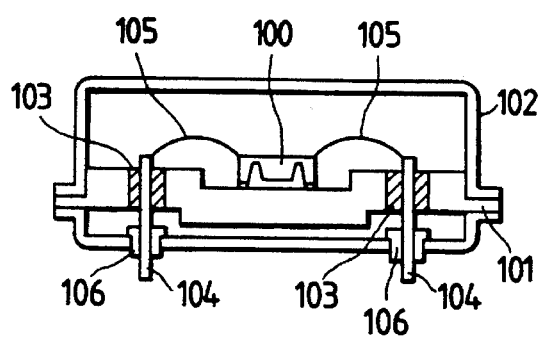
FIG. 31 is a section view showing a state where the sensor of Embodiment 10 is mounted.

FIG. 31 shows a state where the sensor is mounted. A sensor chip 100 is fixed onto a metal stem 101 by soldering, and hermetically sealed in a metal cap 102 which maintains the vacuum condition of the inner space. Terminals 104 pass through the metal stem 101 via hermetic seals 103. The tip ends of the terminals are connected to pads of the sensor chip 100 by bonding wires 105 such as Au wires, respectively. The reference numeral 106 designates lead-through capacitors which prevent noise generated in a power source from affecting the sensor chip 100.

The enclosure structure of the sensor chip 100 which is accomplished by the metal stem 101 and the metal cap 102 prevents the electric field distribution of the sensor chip 100 from being disturbed by an external electric field. In other words, the combination of the metal stem 101 and the metal cap 102 realizes an electrostatic shielding structure. The metal cap 102 functioning as an electrostatic shielding member may be set to be electrically floating, or alternatively may be connected to a predetermined potential.

[Embodiment 11]

Figure 32:
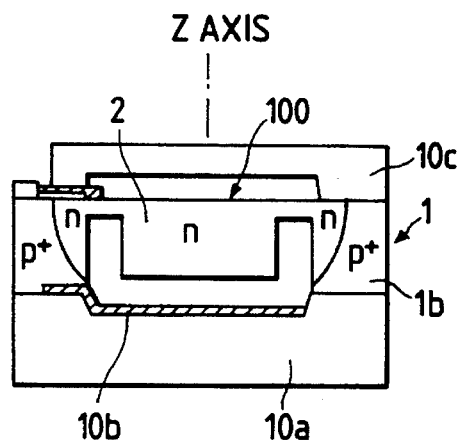
FIG. 32 is a section view showing the configuration of an acceleration sensor according to Embodiment 11 of the invention.

FIG. 32 shows an acceleration sensor of Embodiment 11 of the invention. In the sensor, a metal electrode 10b is formed in a recess of a glass base 10a, and a cover glass 10c covers the upper face of a sensor chip 100. In a fixed unit 1b of a substrate 1, a lower $p^+$-region and an upper n-region are formed and separated from each other by a pn junction. When a negative potential is applied to the lower $p^+$-region and a positive potential to the upper n-region, a movable unit 2 is attracted toward the metal electrode 10b by electrostatic attraction and deformed. In other words, the movable unit 2 can be deformed without applying an acceleration or force to the sensor chip 100. Therefore, the operation check of the sensor can easily be performed. Since the sensor is biasedly deformed when an electrostatic attractive or repulsive force is applied to the movable unit 2, the scattering of the characteristics of sensors can be reduced. The gap between the sensor chip 100 and the glass base 10a and that between the sensor chip 100 and the cover glass 10c are set to be about 1.5 to 2.0 times the normal displacement, in order to perform the stopper function of restraining the movable unit from being abruptly deformed, thereby preventing the sensor chip 100 from being destroyed. The joint between the sensor chip 100 and the glass base 10a and the cover glass 10c can be conducted by a known joining method which is called the electrostatic joint.

[Embodiment 12]

Figure 33A:
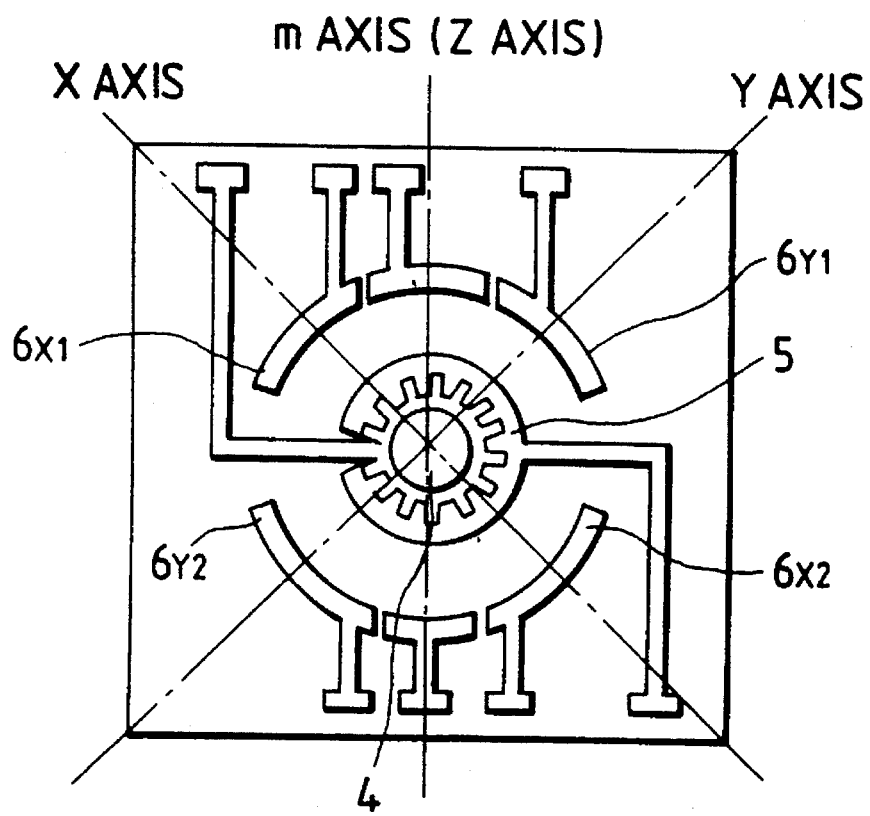
FIG. 33(a) is a plan view showing the configuration of an acceleration sensor of Embodiment 12 of the invention.
Figure 33B:
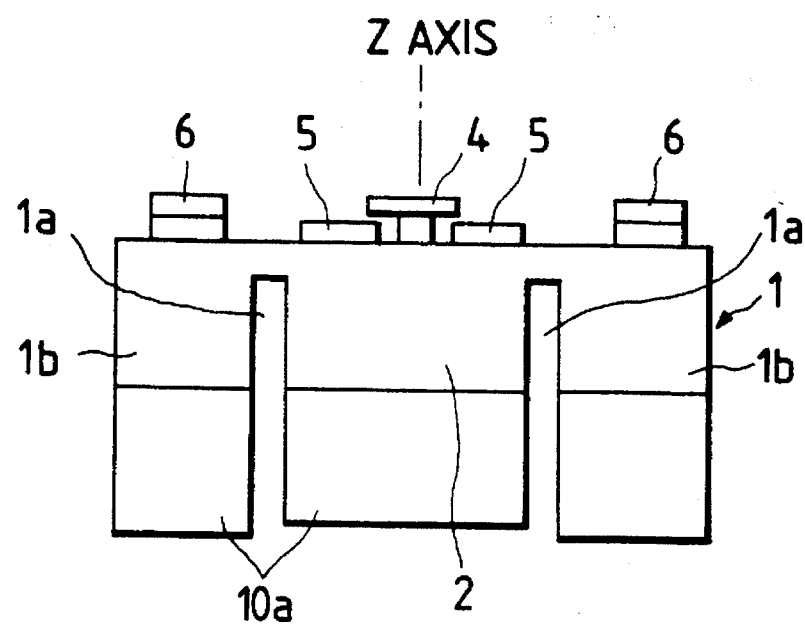
FIG. 33(b) is a section view of the acceleration sensor.
Figure 34:
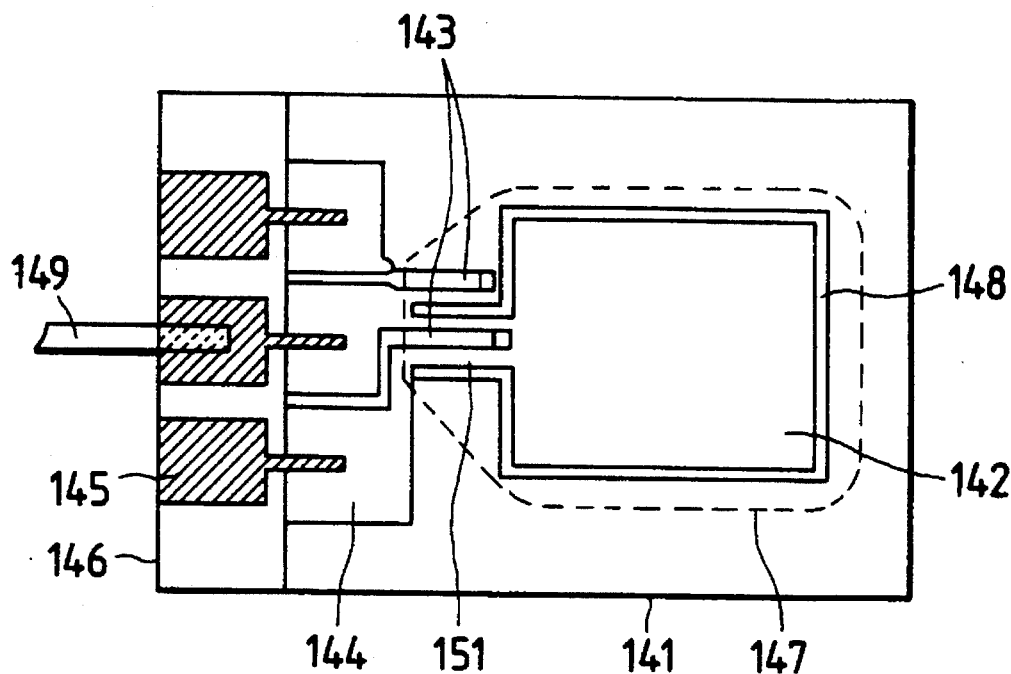
FIG. 34 is a plan view showing a prior art semiconductor acceleration sensor.
Figure 35:
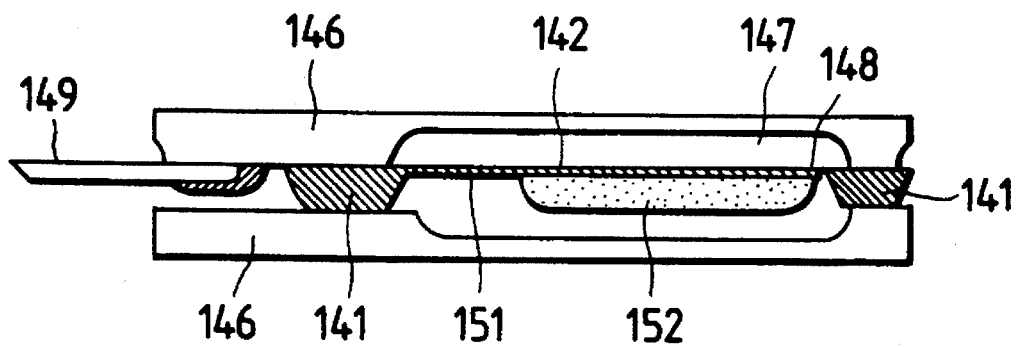
FIG. 35 is a section view of the semiconductor acceleration sensor shown in FIG. 34.
Figure 36:
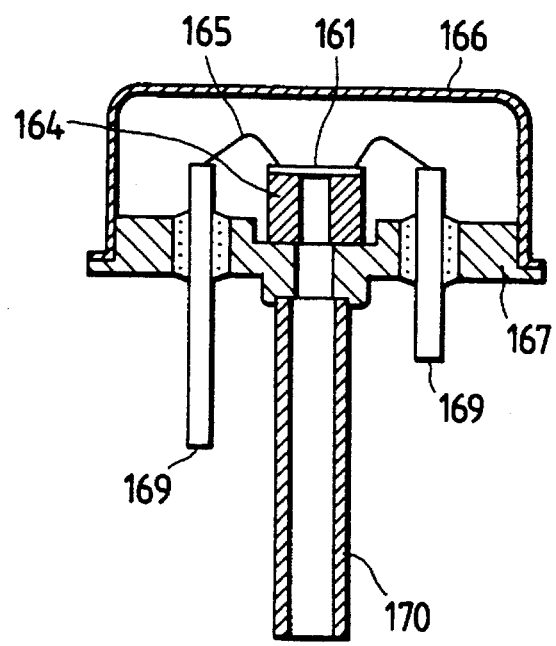
FIG. 36 is a section view showing a prior art semiconductor pressure sensor.
Figure 37:
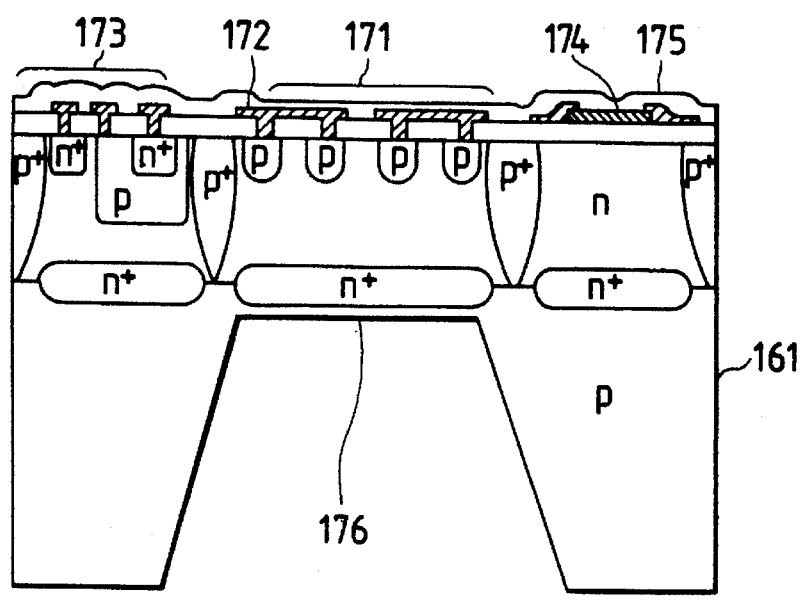
FIG. 37 is a section view showing in an enlarged scale a strain gauge unit of the semiconductor pressure sensor shown in FIG. 36.

FIG. 33 shows an acceleration sensor of Embodiment 12 of the invention. The sensor is a modification of Embodiment 10 shown in FIG. 29, and different therefrom in number and arrangement of anodes. More specifically, as shown in FIG. 33(a), anodes $6_{m1}$ and $6_{m2}$ are disposed on an m-axis which elongates between the X-axis and the Y-axis. An acceleration on the plane formed by the X-axis and the Y- axis can be decomposed into the X-axis component and the Y- axis component. Therefore, the X component of the acceleration can be measured by detecting the change of a synthesized current of anodes $6_{x1}$ and $6_{x2}$ on the X-axis, and the Y component of the acceleration can be measured by detecting the change of a synthesized current of anodes $6_{y1}$ and $6_{y2}$ on the Y-axis. The anodes $6_{m1}$ and $6_{m2}$ on the m-axis are dedicated to the detection of an acceleration in the Z-axis of the space coordinate. An acceleration in the Z-axis can be measured by detecting the change of a synthesized current of the anodes $6_{m1}$ and $6_{m2}$. In order to completely specify an acceleration, moments about the X-, Y- and Z-axes are required in addition to X, Y and Z of the Cartesian coordinates. Accordingly, it is preferable to realize a six-axis detection sensor. Such a six-axis detection sensor can be realized by increasing the number of anodes and improving the electrode arrangement. When a moment about the Z-axis is applied, for example, an emitter electrode 4 rotates so that the opposing area between the end faces (electron emission faces) of the comb teeth and, for example, the anodes $6_{x1}$ and $6_{x2}$ changes in size. This change causes the currents of the anodes $6_{x1}$ and $6_{x2}$ to change in level in the same degree. The magnitude or direction of the moment about the Z-axis can be measured by detecting the current level change.

In the embodiments described above, the anode current is changed in level by deforming the movable unit 2 to change the electric field distribution of the electron emission path or the electron reaching path. Various deformation modes can be attained by changing the geometrical shape of the sensor chip. Alternatively, a field defining electrode for compulsorily defining the field distribution may be adequately formed, or the electron emission path or the electron reaching path for cold electrons may be changed by a magnetic field of a magnet or the like.

As described above, the force sensor of the invention is a cold electron emission type sensor which comprises an electron emission unit having a cathode for emitting electrons, an electron absorption unit having an anode for capturing electrons emitted from the cathode, and control means for controlling the electron capturing efficiency of the anode on the basis of the displacement of a movable unit due to a force or acceleration, and in which the electron capturing efficiency is changed by the spatial deformation.

Accordingly, the force sensor of the invention can attain the following effects:

(1) A force or acceleration can be measured from the rate of change of an output current due to the electron capturing efficiency control of the control means, and the rate of change of an output current can be set to be 100% at the maximum. Therefore, the sensor has an excellent sensitivity. Since the invention employs the field emission, it is possible to construct a force sensor which has little temperature dependency, and an excellent resistance to radioactive rays, a high temperature and a high pressure, and a high environmental resistance.

(2) In the case where an auxiliary anode is disposed between the cathode and the anode so that electrons emitted from the cathode are attracted toward the auxiliary anode and then directed to the anode, the electron capturing efficiency is improved and the sensitivity of the force sensor is improved.

(3) In the case where a field defining electrode for defining the field distribution in the vicinity of the anode is formed, the electron path can be diffused or converged, thereby improving the sensitivity or the resolution.

(4) In the case where a bias electrode for displacing the movable unit by means of an electrostatic attractive or repulsive force is formed, the operation check of the sensor can easily be performed so as to contribute to simplification of the test.

The characteristics of sensors can be standardized by performing the measurement while applying to the bias electrode a potential corresponding to the characteristic deviation of the respective sensors. Therefore, the bias electrode can function as a calibration electrode.

(5) The provision of a plurality of independent anode units on the X-axis and Y-axis enables multidimensional components (including moment components) of a force or acceleration to be detected.

(6) In the-case where the movable unit in a pressure sensor is constructed as a one-end-supported movable unit which projects in a beam-like manner from a thick portion of a substrate, the front end of the one-end-supported movable unit has an easy-reaction property that it largely moves in accordance with a pressure. Therefore, the pressure sensor can detect a minute change in pressure.

(7) In the case where the sensor comprises on the back of a substrate a second electron emission unit, a second electron absorption unit, and a filling material for applying a pressure to the second electron emission unit and the second electron absorption unit in accordance with a pressure which is applied from the surface side of a substrate, it is possible to obtain a large output current so that the rate of change of the output current becomes remarkable, whereby the sensitivity of the pressure sensor can further be improved.

(8) In the case where, in a thus configured pressure sensor, the substrate is a semiconductor substrate, it is possible to conduct a fine patterning in the order of one micron. Accordingly, a pressure sensor can be miniaturized and the range of its use can be extended.

(9) When a movable unit such as a diaphragm unit of a pressure sensor is provided with a gas filled unit for applying a pressure corresponding to a temperature, so as to constitute a temperature sensor, it is possible to constitute a temperature sensor which is excellent in responsibility and which has a high environmental resistance and a high reliability. Furthermore, a temperature/pressure sensor device can easily be constituted by forming a pressure sensor and a temperature sensor on the same substrate, thereby achieving a sensor device which can detect both a pressure and a temperature with a high sensitivity and which has an excellent environmental resistance.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An acceleration sensor comprising:

a substrate having a movable unit which is displaceable in response to acceleration;

an electron emission unit having a cathode for emitting electrons in accordance with an applied potential;

an electron absorption unit having an anode for capturing electrons emitted from said cathode, said electron emission unit and said electron absorption unit being formed on a surface of said substrate;

said movable unit comprising a diaphragm formed by thinning said substrate at a location between said electron emission unit and said electron absorption unit, the diaphragm being deformable by acceleration;

an auxiliary electrode for forming an electric field between said cathode and said anode, said electric field attracting electrons emitted from said cathode to direct the electrons toward said anode;

said diaphragm functioning as a control means for controlling the electron capturing efficiency of said anode with respect to electrons emitted from said cathode, and being displacable to block an electron path from said cathode to said anode, thereby controlling said electron capturing efficiency.

2. A acceleration sensor according to claim 1 having a geometry including X, Y and Z axes, and wherein said cathode of said electron emission unit is located at the center of said movable unit, and said anode of said electron absorption unit comprises a plurality of independent anode units located symetrically around said movable unit on the X and Y axes.

3. A force sensor according to claim 1, having a geometry including X, Y and Z axes, and wherein said anode of said electron absorption unit comprises a plurality of independent anode units on the X and Y axes, said anode units being formed on said movable unit and angularly symmetric in the circumferential direction, and wherein said cathode of said electron emission unit is formed around said movable unit.

4. A force sensor according to claim 2, wherein an anode unit dedicated to the Z-axis is formed at the middle of an anode unit for the X-axis and an anode unit for the Y-axis.

5. A force sensor according to claim 2, wherein said cathode has a comb-like annular shape.

* * * * *

UNITED STATES PATENT AND TRADEMARK OFFICE
CERTIFICATE OF CORRECTION

PATENT NO. : 5,492,011
DATED : February 20, 1996
INVENTOR(S) : Akira AMANO et al It is certified that error appears in the above-indentified patent and that said Letters Patent is hereby corrected as shown below:

In Claim 1, Col. 25, line 23, "displacable" should read --displaceable--.

In Claim 2, Col. 26, line 3, "A" (first occurrence) should read --An--.

In Claim 2, Col. 26, line 8, "symetrically" should read --symmetrically--.

Signed and Sealed this

Nineteenth Day of November, 1996

Attest:

BRUCE LEHMAN

*Attesting Officer*   *Commissioner of Patents and Trademarks*